(12) United States Patent
Endo

(10) Patent No.: US 8,133,787 B2
(45) Date of Patent: *Mar. 13, 2012

(54) SIC SEMICONDUCTOR DEVICE AND METHOD FOR MANUFACTURING THE SAME

(75) Inventor: Takeshi Endo, Obu (JP)

(73) Assignee: Denso Corporation, Kariya (JP)

( * ) Notice: Subject to any disclaimer, the term of this patent is extended or adjusted under 35 U.S.C. 154(b) by 728 days.

This patent is subject to a terminal disclaimer.

(21) Appl. No.: 12/071,718

(22) Filed: Feb. 26, 2008

(65) Prior Publication Data
US 2008/0203441 A1    Aug. 28, 2008

(30) Foreign Application Priority Data
Feb. 28, 2007    (JP) .................................. 2007-49705

(51) Int. Cl.
H01L 21/8234    (2006.01)

(52) U.S. Cl. ........ 438/275; 438/276; 438/279; 438/931; 257/E29.257

(58) Field of Classification Search .......... 438/275–280, 438/931; 257/E29.257
See application file for complete search history.

(56) References Cited

U.S. PATENT DOCUMENTS

| | | | |
|---|---|---|---|
| 5,736,753 A | 4/1998 | Ohno et al. | |
| 5,907,188 A * | 5/1999 | Nakajima et al. | 257/751 |
| 5,976,936 A | 11/1999 | Miyajima et al. | |
| 6,020,600 A | 2/2000 | Miyajima et al. | |
| 6,136,727 A * | 10/2000 | Ueno | 438/770 |
| 6,573,534 B1 | 6/2003 | Kumar et al. | |
| 6,764,963 B2 | 7/2004 | Fukuda et al. | |
| 7,824,995 B2 * | 11/2010 | Endo et al. | 438/308 |
| 2003/0013266 A1 | 1/2003 | Fukuda et al. | |
| 2004/0242022 A1 | 12/2004 | Kosugi et al. | |
| 2005/0064639 A1 * | 3/2005 | Hisada et al. | 438/197 |
| 2005/0245034 A1 * | 11/2005 | Fukuda et al. | 438/285 |
| 2006/0151806 A1 | 7/2006 | Fukuda et al. | |
| 2007/0045631 A1 | 3/2007 | Endo et al. | |
| 2007/0048917 A1 | 3/2007 | Yamamoto et al. | |
| 2007/0057262 A1 * | 3/2007 | Nakamura et al. | 257/77 |
| 2008/0203402 A1 | 8/2008 | Endo | |
| 2008/0203441 A1 | 8/2008 | Endo | |
| 2009/0057686 A1 | 3/2009 | Fukuda et al. | |

FOREIGN PATENT DOCUMENTS

JP    A-10-112460    4/1998
(Continued)

OTHER PUBLICATIONS

U.S. Appl. No. 12/071,717, filed Feb. 26, 2008, Endo et al.
(Continued)

*Primary Examiner* — H. Jey Tsai
(74) *Attorney, Agent, or Firm* — Posz Law Group, PLC

(57) ABSTRACT

A SiC semiconductor device having a MOS structure includes: a SiC substrate; a channel region providing a current path; first and second impurity regions on upstream and downstream sides of the current path, respectively; and a gate on the channel region through the gate insulating film. The channel region for flowing current between the first and second impurity regions is controlled by a voltage applied to the gate. An interface between the channel region and the gate insulating film has a hydrogen concentration equal to or greater than $4.7 \times 10^{20}$ cm$^{-3}$. The interface provides a channel surface having a (000-1)-orientation surface.

1 Claim, 21 Drawing Sheets

FOREIGN PATENT DOCUMENTS

| | | |
|---|---|---|
| JP | A-11-031691 | 2/1999 |
| JP | A-2000-252461 | 9/2000 |
| JP | A-2000-286258 | 10/2000 |
| JP | A-2001-053293 | 2/2001 |
| JP | A-2005-166930 | 6/2005 |
| JP | A-2006-269641 | 10/2006 |

OTHER PUBLICATIONS

Notice of Allowance mailed Jun. 25, 2010 in related U.S. Appl. No. 12/071,717.

Extended European Search Report dated Jul. 9, 2009 issued from the European Patent Office in European patent application No. 08003499.4-1235, which corresponds to related U.S. Appl. No. 12/071,717.

J. Senzaki, et al., "Effects of Pyrogenic Reoxidation Annealing on Inversion Channel Mobility of 4H-SiC Metal-Oxide-Semiconductor Field-Effect Transistor Fabricated on (1120) Face," Japanese Journal of Applied Physics, Japan Society of Applied Physics, Nov. 2001, vol. 40, No. 11B, part 2, pp. L1201-11203.

H. Yano, et al., "High Channel Mobility in Inversion Layers of 4H-SiC MOSFET's by Utilizing (1120) Face," *IEEE Electron Device Letters*, Dec. 1999, IEEE Service Center, vol. 20. No. 12.

J. Senzaki, et al., "Significant Improvement of Inversion Channel Mobility in 4H-Sic MOSFET on (1120) Face Using Hydrogen Post-Oxidation Annealing," *Materials Science Forum* (2002), vol. 389-393, pp. 1061-1064.

J. Senzaki, et al., "Excellent Effects of Hydrogen Postoxidation Annealing on Inversion Channel Mobility of 4H-SiC MOSFET Fabricated on (1120) Face" *IEEE Electron Device Letters*, Jan. 2002, IEEE Service Center, vol. 23, No. 1.

Office Action dated Dec. 30, 2009 in corresponding U.S. Appl. No. 12/071,717.

Office Action dated Nov. 18, 2010 from the German Patent Office in corresponding DE patent application No. 10 2008 011 648.3-33 (English translation enclosed).

Karsten Brendel, "Laser-crystallized of polycrystalline silicon," Philipps University Marburg (2003). (Machine English translation enclosed).

Office Action dated Mar. 22, 2011 issued in corresponding JP Patent Application No. 2008-040097 claiming priority from JP patent application No. 2007-49705 (English translation of JP office action enclosed).

\* cited by examiner (11−20)FACE (0001)Si FACE (000−1)C FACE

SIC SEMICONDUCTOR DEVICE AND METHOD FOR MANUFACTURING THE SAME

CROSS REFERENCE TO RELATED APPLICATION

This application is based on Japanese Patent Application No. 2007-49705 filed on Feb. 28, 2007, the disclosure of which is incorporated herein by reference. This application is also related to U.S. application Ser. No. 12/071,717, entitled "SIC SEMICONDUCTOR DEVICE AND METHOD FOR MANUFACTURING THE SAME", filed on Feb. 26, 2008.

FIELD OF THE INVENTION

The present invention relates to a SiC semiconductor device and a method for manufacturing a SiC semiconductor device.

BACKGROUND OF THE INVENTION

Japanese Patent Application Laid-Open Publication No. 2003-69012 corresponding to U.S. Pat. No. 6,764,963 discloses a conventional method which performs treatment with hydrogen annealing or a wet atmosphere in a SiC semiconductor device using a crystal a-face with a (11-20) face orientation for a channel, thereby reducing an interface state density in a MOS structure and improving a channel mobility. Specifically, the reduction in interface state density is achieved by selecting a concentration or a temperature for the hydrogen annealing or the wet atmosphere.

FIGS. 22A and 22B are crystal-face schematic views showing the relationships between a hexagonal crystal structure of SiC and the surface orientations of crystal faces, i.e., a (11-20) face, a (0001) Si face, and a (000-1) C face. As shown in FIG. 22B, the upper and lower surfaces of the hexagonal crystal correspond to the (0001) Si face and the (000-1) C face, respectively, to which the (11-20) face is in perpendicular relation.

A face perpendicular to the (0001) Si face, such as the (11-20) face, is smaller in wafer diameter than the (0001) Si face due to problems associated with a crystal growth technique. Accordingly, it is desired to use a wafer with the (0001) Si face or the (000-1) C face. However, even when 5-hour wet oxidation at a high temperature of 1080° C. is performed with respect to the wafer with the (0001) Si face, only an oxidation film with a thickness of about 40 nm is formed thereon. Therefore, the wafer with the (0001) Si face has the problems that it cannot be thickened by thermal oxidation and that CMP polishing for processing the substrate surface using an oxidation reaction takes a time. On the other hand, the wafer with the (000-1) C face has an oxidation rate about 20 times higher than that of the wafer with the (0001) Si face. This allows easy formation of a thick thermal oxidation film and also allows high-speed CMP polishing. Therefore, the wafer with the (000-1) C face is more excellent in mass productivity than the wafer with the (0001) Si face, and a MOSFET using the wafer with the (000-1) C face is highly expected. However, a MOS interface formation method which reduces the interface state density at the (000-1) C face has not been disclosed. In Japanese Patent Application Laid-Open Publication No. 2003-69012 shown above also, only a method of reducing the interface state density at the (11-20) face is disclosed, and a technique for reducing the interface state density at the (000-1) C face is not disclosed.

Thus, it is required for a SiC semiconductor device to improve a channel mobility.

SUMMARY OF THE INVENTION

In view of the above-described problem, it is an object of the present disclosure to provide a silicon carbide semiconductor device with high channel mobility. It is another object of the present disclosure to provide a method for manufacturing a silicon carbide semiconductor device with high channel mobility.

According to a first aspect of the present disclosure, a silicon carbide semiconductor device having a MOS structure includes: a substrate made of silicon carbide and having a principal surface; a channel region made of silicon carbide and disposed in the substrate, wherein the channel region provides a current path as a channel; a first impurity region disposed on an upstream side of the current path and a second impurity region disposed on a downstream side of the current path; a gate insulating film disposed on a surface of the channel region; and a gate disposed on the gate insulating film. The channel of the channel region for flowing current between the first impurity region and the second impurity region is controlled by a voltage applied to the gate. An interface between the channel region and the gate insulating film has a hydrogen concentration equal to or greater than $4.7 \times 10^{20}$ cm$^{-3}$, and the interface provides a channel surface having a (000-1)-orientation surface.

By thus using the substrate having the (000-1) C face as the principal surface thereof, terminating the dangling bond at the interface between the channel region and the gate insulating film with H or OH, and setting the hydrogen concentration at the interface to a high value of not less than $4.7 \times 10^{20}$ cm$^{-3}$, the interface state density lowers and a silicon carbide semiconductor device with a high channel mobility can be provided.

According to a second aspect of the present disclosure, a method for manufacturing a silicon carbide semiconductor device having a MOS structure, the method includes: preparing a substrate made of silicon carbide having a principal surface; forming a channel region made of silicon carbide on the substrate, wherein the channel region provides a current path as a channel; forming a first impurity region on an upstream side of the current path and a second impurity region on a downstream side of the current path; forming a gate insulating film on a surface of the channel region; forming a gate on the gate insulating film; and performing a heat treatment. The channel of the channel region for flowing current between the first impurity region and the second impurity region is controlled by a voltage applied to the gate. The performing the heat treatment includes: reducing temperature in a range between 650° C. and 850° C.; and maintaining a wet atmosphere or a hydrogen atmosphere continuously in the reducing the temperature. The interface provides a channel surface having a (000-1)-orientation surface.

By maintaining the wet atmosphere or the hydrogen atmosphere continuously in the reducing the temperature, the dangling bond at an interface between the gate insulating film and the channel region is terminated with the H atom or the OH group. Thus, the interface state density lowers and a silicon carbide semiconductor device with a high channel mobility can be provided.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
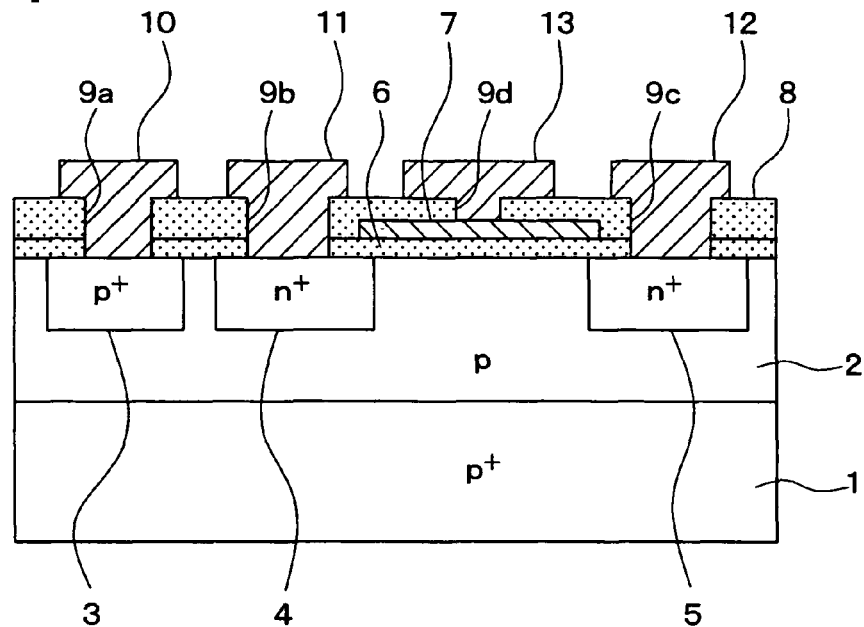
FIG. 1 is a view showing a cross-sectional structure of an inversion-mode lateral MOSFET according to a first embodiment.

The present inventors have examined whether or not a reduction in interface state density is achievable by the conventional technique, i.e., when wet annealing or hydrogen annealing is performed in the manufacturing of a semiconductor element having a MOS structure using a SiC substrate having the (000-1) C face as the principal surface thereof. As a result, it has been recognized that the interface state density cannot be reduced by merely forming a gate oxide film in a wet atmosphere at a predetermined concentration or a predetermined temperature, or by merely performing hydrogen annealing at a predetermined concentration or a predetermined temperature.

To reduce the interface state density, it can be considered that dangling bonds at the interface between SiC and a gate oxide film is terminated with a H or OH element. Specifically, when a state is held in which H or OH has entered a defective portion in the lower layer portion of the gate oxide film in contact with SiC, a reduction in interface state density can be achieved.

To realize such a structure, the present inventors have conducted a dedicated study, and recognized that a temperature at which the dangling bonds at the interface between SiC and the gate oxide film are terminated with H or OH, i.e., a temperature at which desorption occurs (hereinafter referred to as the termination-desorption temperature) is determined, and what is important in realizing the structure mentioned above is whether or not an atmosphere is established in which the desorption of H or OH does not occur at the termination-desorption temperature.

That is, because the termination with H or OH or the desorption of H or OH is performed at the termination-desorption temperature, the desorption occurs in a situation in which the desorption is predominant over the termination at the temperature, and the desorption can be prevented in a situation in which the termination is predominant over the desorption.

Accordingly, even though gate oxidation is performed in a wet atmosphere, when the wet atmosphere is no more wet on reaching the termination-desorption temperature, the desorption of H or OH from the dangling bonds occurs to prevent the realization of the structure mentioned above. Even though hydrogen annealing is performed, the desorption of H or OH proceeds unless a hydrogen atmosphere is constantly present at a temperature exceeding the termination-desorption temperature and, eventually, the structure mentioned above cannot be realized.

Based on the foregoing, the present inventors have learned by the following method that, when the temperature is decreased to a level not more than the termination-desorption temperature in a wet atmosphere during a temperature decrease period in the step of forming a gate insulating film, it is possible to realize the structure mentioned above and reduce the interface state density. Specifically, a gate oxide film was formed by wet oxidation, the temperature was decreased in a state in which the wet atmosphere was maintained, and the relationship between the interface state density and the temperature at which the atmosphere was switched from the wet atmosphere to the nitrogen atmosphere during the temperature decrease period was examined.

Figure 23A:
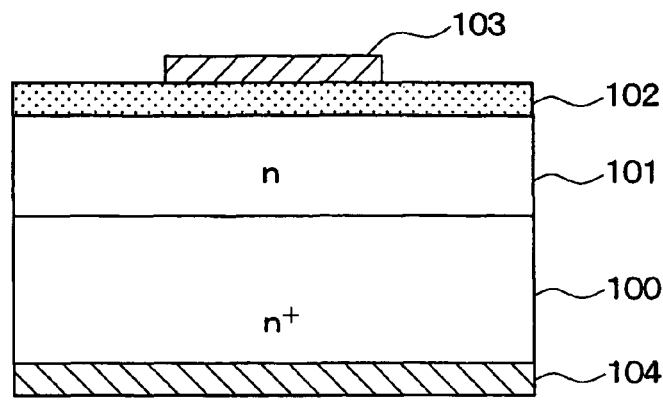
FIG. 23A is a cross-sectional view of each of MOS capacitors as samples used in an experiment and FIG. 23B is a graph showing the relationship between an atmosphere switching temperature and an interface state density.
Figure 23B:
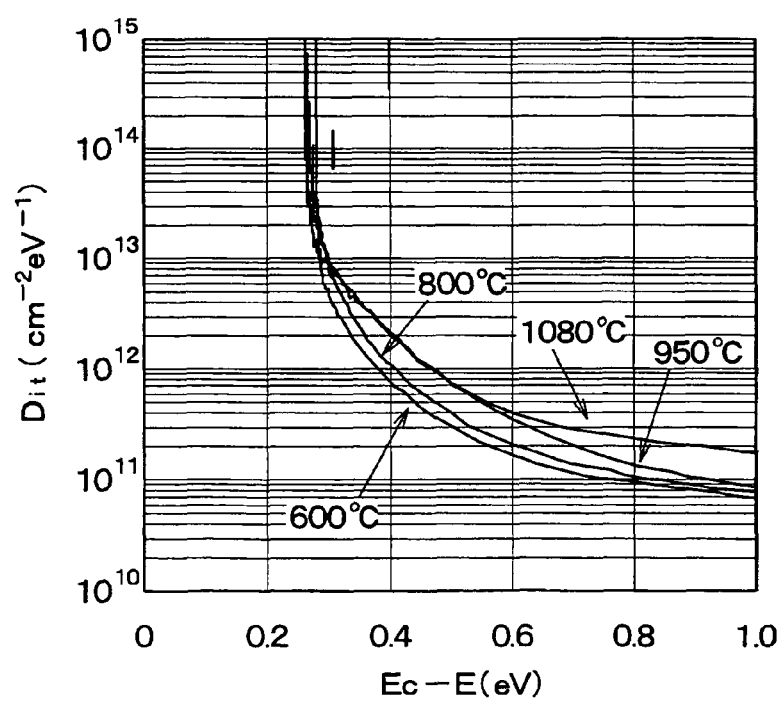

FIG. 23A is a cross-sectional view of each of MOS capacitors as samples used in an experiment. FIG. 23B shows the relationship between the atmosphere switching temperature and the interface state density.

As shown in FIG. 23A, an n-type epitaxial layer 101 having an impurity concentration of $1\times10^{16}$ cm$^{-3}$ was formed on an n$^+$-type layer 100 to provide a substrate having the (000-1) C face as a surface thereof. Gate oxidation was performed with respect to the substrate to form a gate oxide film 102. At this time, the gate oxidation was performed by increasing a temperature to 1080° C. in a nitrogen atmosphere, switching the nitrogen atmosphere to a wet atmosphere to perform wet oxidation for 25 minutes, and decreasing the temperature at 10° C./min, while maintaining the wet atmosphere. At this time, the switching temperature from the wet atmosphere to the nitrogen atmosphere was varied to 1080° C., 950° C., 800° C., and 600° C. After Ni films 103 and 104 each having a thickness of 500 nm were vapor deposited on the top and back surfaces, the Ni films were each patterned to $\phi$500 $\mu$m to construct the MOS capacitors.

As a result of evaluating the interface state density ($D_{it}$) of each of the MOS capacitors for which the switching temperature were varied, it could be recognized that the interface state density was reduced by lowering the switching temperature from the wet atmosphere to the nitrogen atmosphere during the temperature decrease period, as shown in FIG. 23B. The interface state density in the vicinity of a conduction band, which is an energy band at a high interface state density, was greatly reduced in the range where the switching temperature from the wet atmosphere to the nitrogen atmosphere was 950 to 600° C. From the result, it can be seen that the effect of terminating the dangling bonds with H or OH was obtained primarily in the temperature range lower than 950° C.

From the result of the experiment, it can be said that, even at the (000-1) C face, the effect of terminating the dangling bonds can be obtained by maintaining the wet atmosphere down to a low temperature (e.g., 600° C.) during the temperature decrease period in the step of forming the gate oxide film.

Figure 24A:
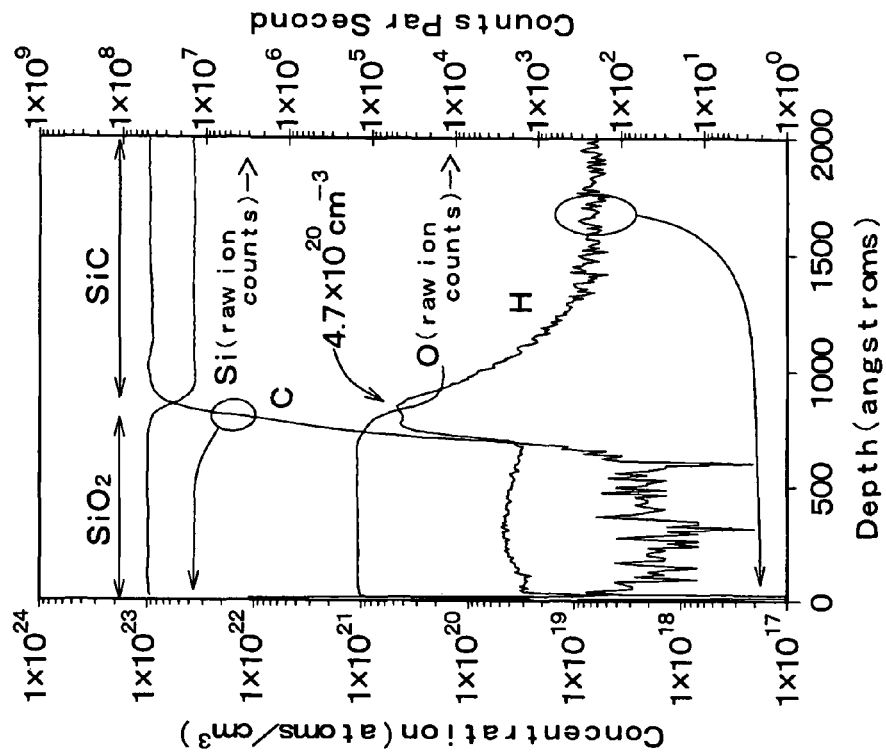
FIGS. 24A and 24B are views showing respective hydrogen concentrations in the vicinities of the interfaces between SiC and gate oxide films (SiO2) in MOS capacitors fabricated by setting the switching temperature from a wet atmosphere to a nitrogen atmosphere during a temperature decrease period in a gate oxidation process at 1080° C. and 600° C.
Figure 24B:
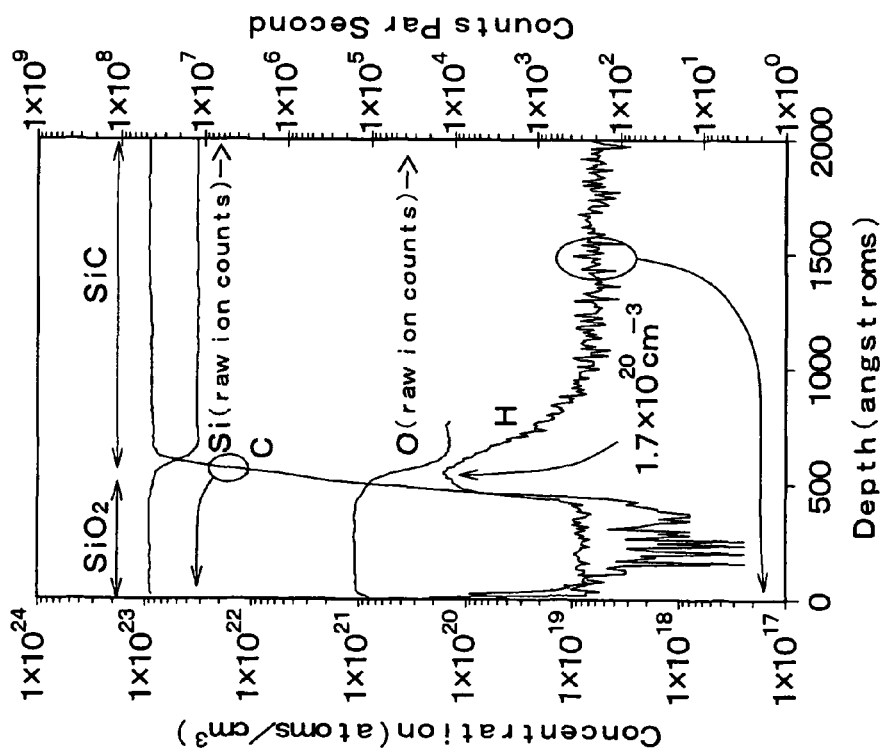

To verify the effect of terminating the dangling bonds with H or OH by the experiment described above, a comparison was made between hydrogen concentrations at the interfaces in the case of using the (000-1) C face by SIMS analysis. FIGS. 24A and 24B are views showing the respective hydrogen concentrations in the vicinities of the interfaces between SiC and gate oxide films (SiO$_2$) in MOS capacitors fabricated by setting the switching temperature from the wet atmosphere to the nitrogen atmosphere during the temperature decrease period in the gate oxidation process at 1080° C. and 600° C.

As shown in the drawings, from the result of the comparison between the hydrogen concentrations at the interfaces between SiC and the gate oxide films, it can be seen that the hydrogen concentration when the switching temperature from the wet atmosphere to the nitrogen atmosphere during the temperature decrease period was at 1080° C. was about $1.7\times10^{20}$ cm$^{-3}$, while the hydrogen concentration at the switching temperature of 600° C. was about $4.7\times10^{20}$ cm$^{-3}$, which is about triple the hydrogen concentration when the switching temperature from the wet atmosphere to the nitrogen atmosphere during the temperature decrease period was at 1080° C. That is, by maintaining the wet atmosphere during the temperature decrease period, it is possible to terminate the dangling bonds with H or OH. From the result also, it can be said that a high hydrogen concentration at the interface, i.e., the termination of the dangling bonds with H or OH leads to a reduction in interface state density.

When the gate oxide film is thus formed by maintaining the wet atmosphere down to a level at least not more than the termination-desorption temperature during the temperature decrease period, it becomes possible to terminate the dangling bonds at the interface between SiC and the gate oxide film with H or OH.

From the same concept underlying the findings, it can be said that it is also possible to form the gate oxide film by a technique different from the wet oxidation using the wet atmosphere, switch the atmosphere to the wet atmosphere only during the temperature decrease period, and thereby terminate the dangling bonds at the interface between SiC and the gate oxide film with H or OH during the temperature decrease period.

For example, the gate oxide film is formed by performing oxidation in a dry atmosphere, a N$_2$O atmosphere, a NO atmosphere, an ozone atmosphere, a H$_2$O radical atmosphere, or the like or, alternatively, by depositing LTO, TEOS, HTO, or the like by CVD or the like. At this time, because a chamber for forming the gate oxide film is in a high-temperature internal state, it is appropriate to switch the atmosphere appropriately from the state to the wet atmosphere by introducing H$_2$O into the chamber and decrease the temperature to a level not more than the termination-desorption temperature.

Although the description has been given herein to the case where the gate insulating film is composed of the oxide film, when this technique is used, it is also possible to compose the gate insulating film of an insulating film of another type. For example, there can be listed HfO$_2$, HfSiON, HfAlO, Al$_2$O$_3$, Ta$_2$O$_5$, Si$_3$N$_4$, or the like.

Likewise, the same process can also be performed differently, not by terminating the dangling bond at the interface between SiC and the gate oxide film with H or OH during the temperature decrease period in the formation of the gate oxide film (gate insulating film), but by an annealing step after the step of forming the gate oxide film. It will be easily appreciated that, by performing both of the processes, a larger number of dangling bonds at the interface between SiC and the gate oxide film can be terminated with H or OH and a further reduction can be achieved in interface state density.

Next, to specify the termination-desorption temperature in detail, a thermal desorption spectroscopy analysis was conducted. Specifically, a substrate formed with a gate oxide film was increased in temperature by laser heating in a vacuum chamber and elements resulting from desorption were examined with a mass spectrometer. This allows detailed specification of a desorption gas and a desorption temperature.

However, because a large amount of hydrogen also exists in an ambient atmosphere, it is difficult to distinguish an extremely small amount of hydrogen at the MOS interface from the hydrogen in the ambient atmosphere. To eliminate the difficulty, there was used a technique which used deuterium (D) as an isotope of hydrogen rarely existing in the ambient atmosphere as an element for terminating a dangling bond and analyzed the deuterium. It can be considered that, because hydrogen and deuterium are isotopes, the respective properties thereof related to the termination or desorption are substantially the same.

A specific method of producing an assay sample will be described next. First, an n-type 4H—SiC substrate having the (000-1) C face as the principal surface thereof was used as a substrate. Wet oxidation was performed with respect to the substrate by bubbling a deuterium oxide ($D_2O$) in accordance with a bubbling oxidation method, thereby forming a gate oxide film. A recipe for forming the gate oxide film changed $H_2O$ in FIGS. 4A and 4B, which will be described later, to $D_2O$. Then, the thermal desorption spectroscopy analysis was performed with the sample. As assay elements, $D_2$ and $D_2O$ were specified. The analysis was performed with respect to $D_2$ and $D_2O$ in moisture in the insulating film on the assumption that D resulting from the desorption binds to another D to form $D_2$, and OD resulting from the desorption binds to D to form $D_2O$.

Figure 25A:
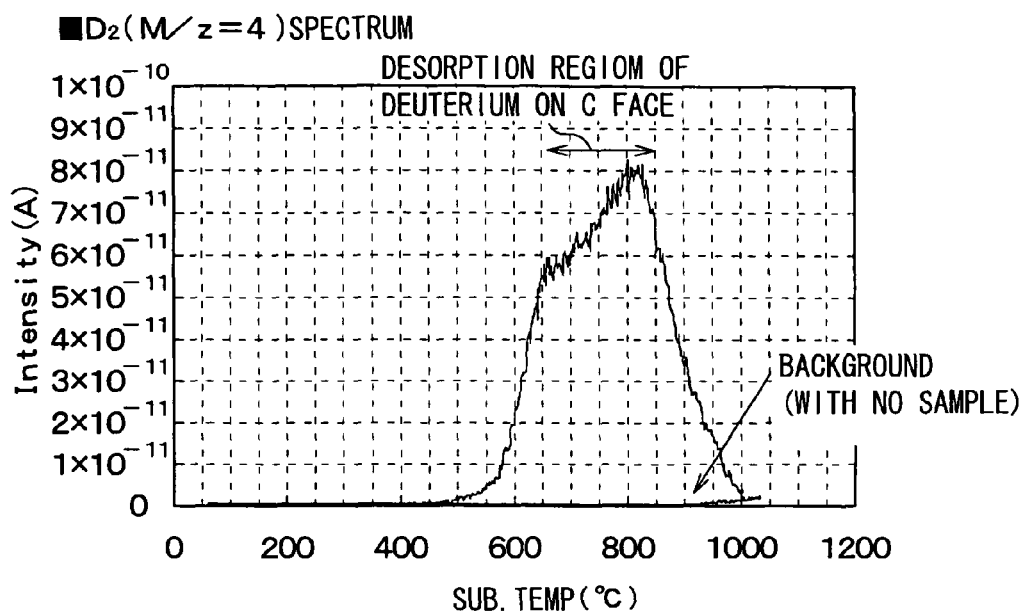
FIG. 25A is a view showing the result of analyzing the desorption temperature of deuterium by thermal desorption spectroscopy and FIG. 25B is a view showing the result of analyzing the desorption temperature of a deuterium oxide by thermal desorption spectroscopy.
Figure 25B:
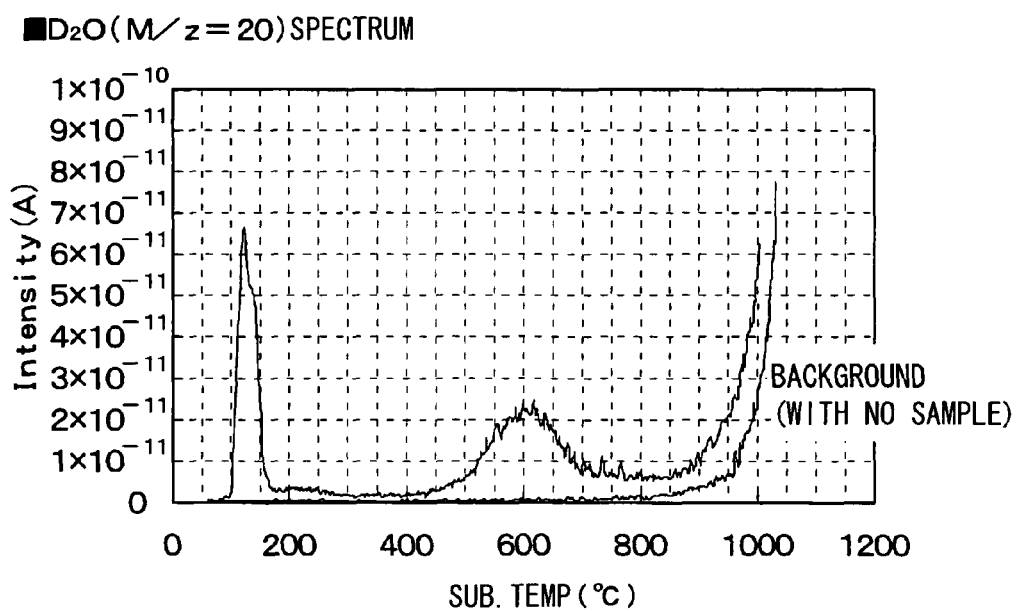

FIG. 25A is a graph showing the result of the analysis related to $D_2$. FIG. 25B is a graph showing the result of the analysis related to $D_2O$. In each of the drawings, the ordinate represents the current intensity in the mass spectrometer. The graphs shown as backgrounds in the respective drawings represent the results of the analysis in the absence of the sample. Values obtained by subtracting values in the background graphs from the corresponding values in the graphs representing the results of analyzing $D_2$ and $D_2O$ show pure amounts of $D_2$ and $D_2O$ obtained by mass spectrometry.

As shown in FIG. 25A, the desorption of $D_2$ occurs in the range of 650 to 850° C. The peak of the desorption is seen particularly in the range of 750 to 850° C., which coincides with the temperature at which the interface state density is reduced. From this, it can be specified that the temperature at which the termination of dangling bonds with H or OH or the desorption of H or OH occurs is in the range of 650 to 850° C., particularly 750 to 850° C. On the other hand, as shown in FIG. 25B, the desorption of $D_2O$ occurs in the vicinity of 600° C. From these, it can be considered that an element which terminates a dangling bond and contributes to a reduction in interface state density is primarily hydrogen. By performing annealing at 650° C., an annealing process for removing moisture in the gate insulating film can be performed, and the reliability of the gate oxide film can be improved.

Figure 26:
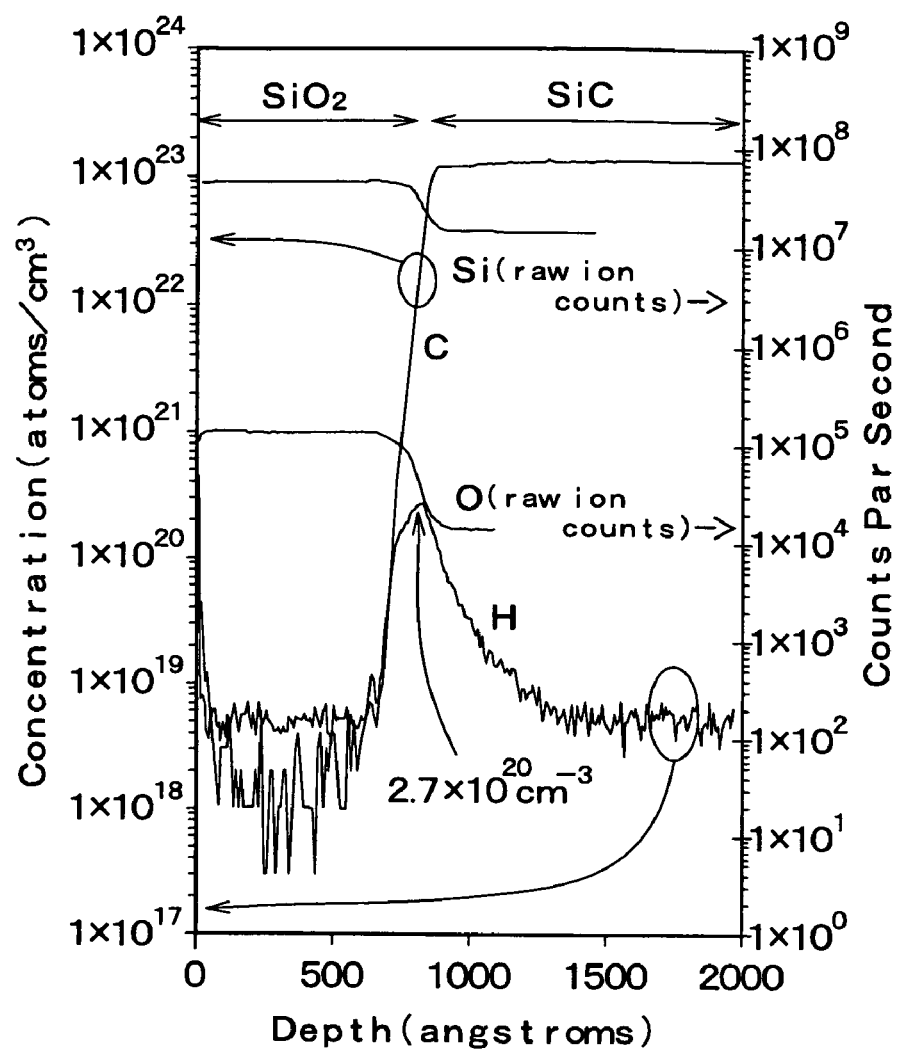
FIG. 26 is a view showing hydrogen concentrations in the vicinities of the interfaces between SiC and gate oxide films (SiO2) in MOS capacitors obtained by performing a 10-minute Ar annealing step at 1000° C. with respect to the analyzed samples of FIG. 24B.

FIG. 26 shows the result of examining the hydrogen concentration when an Ar annealing step at an annealing temperature of 1000° C. was performed for 10 minutes with respect to the sample analyzed in FIG. 24B. As shown the drawing, the hydrogen concentration at the interface between SiC and the gate oxide film decreased compared with that shown in FIG. 24B. From this, the desorption of H or OH from the dangling bonds at the interface between SiC and the gate oxide film can be recognized.

From the result, it can be said that, to perform an annealing step in which the termination with H or OH is predominant over the desorption of H or OH, it is sufficient to set the annealing temperature at a level of not less than the termination-desorption temperature and establish an atmosphere capable of terminating the dangling bonds with H or OH even when the temperature is not less than the termination-desorption temperature, while continuously maintaining the atmosphere during a temperature decrease period in the annealing step till the temperature becomes not more than the termination-desorption temperature.

Therefore, it is appropriate to perform an annealing step in which the atmosphere capable of constantly terminating the dangling bonds with H or OH is maintained when the annealing temperature is not less than 650° C.

The description of the termination-desorption temperature given herein similarly holds true when the temperature decreases in the step of forming the gate oxide film. That is, when the wet atmosphere is continuously maintained while the temperature is in the range of 650 to 850° C. during the temperature decrease period, it becomes possible to maintain the state in which the dangling bonds at the interface between SiC and the gate oxide film are terminated with H or OH even after the step of forming the gate oxide film.

First Embodiment

In view of the above study, in the present embodiment, an inversion-mode lateral MOSFET is provided. FIG. 1 shows a cross-sectional structure of the inversion-mode lateral MOSFET, while FIGS. 2A to 2C and 3A to 3C show the steps of manufacturing the inversion-mode lateral MOSFET shown in FIG. 1. Referring to these drawings, the structure and manufacturing method of the inversion-mode lateral MOSFET according to the present embodiment will be described.

As shown in FIG. 1, a $p^+$-type substrate 1 made of SiC has a principal surface on one side thereof, and a p-type base layer 2 made of epitaxially grown SiC is formed on the principal surface of the $p^+$-type substrate 1 to provide a $p/p^+$ substrate used as a semiconductor substrate. As the $p^+$-type substrate 1, a substrate made of, e.g., 4H—SiC, having a (000-1) C face as the principal surface, and having an impurity concentration of about $5 \times 10^{18}$ cm$^{-3}$ is used. The p-type base layer 2 has an impurity concentration of, e.g., about $5 \times 10^{15}$ cm$^{-3}$. By using such a $p/p^+$ substrate as the semiconductor substrate, the inversion-mode lateral MOSFET is formed.

In a surface area of the p-type base layer 2, a $p^+$-type base contact region (hereinafter simply referred to as the contact region) 3 is formed. The contact region 3 has an impurity concentration higher than that of the p-type base layer 2, e.g., an impurity concentration of not less than $3 \times 10^{20}$ cm$^{-3}$, and a depth of 0.4 μm. The contact region 3 is used to fix the potential of the p-type base layer 2.

In the surface area of the p-type base layer 2, an $n^+$-type source region 4 and an $n^+$-type drain region 5 are formed to be spaced apart from the contact region 3. The $n^+$-type source region 4 and the $n^+$-type drain region 5 are formed to be spaced apart from each other. Each of the $n^+$-type source region 4 and the $n^+$-type drain region 5 has a high concentration of, e.g., not less than $3 \times 10^{20}$ cm$^{-3}$ and a depth of 0.3 μm.

A gate oxide film 6 having a thickness of, e.g., 110 nm and using the portion of the surface area of the p-type base layer 2 interposed between the $n^+$-type source region 4 and the $n^+$-type drain region 5 as a channel region is formed so as to cover at least the surface of the channel region. The interface between the gate oxide film 6 and the p-type base layer 2 composing the channel region has a structure in which dangling bonds are each terminated with a H or OH element. The interface provides a channel surface having a (000-1)-orientation surface.

On the surface of the gate oxide film 6, a gate 7 made of polysilicon doped with, e.g., an n-type impurity (e.g., P (phosphorus)) is formed through patterning.

To cover the gate 7 and the other portion of the gate oxide film 6, an interlayer insulating film 8 made of, e.g., LTO is formed. Contact holes 9a to 9c connecting to the contact region 3, to the $n^+$-type source region 4, and to the $n^+$-type drain region 5 are formed in each of the interlayer insulating film 8 and the gate oxide film 6, while a contact hole 9d connecting to the gate 7 is formed in the interlayer insulating film 8.

Through the respective contact holes 9a to 9d, a base electrode 10 for fixing a potential, a source electrode 11, a drain electrode 12, and a gate electrode 13 are electrically connected to the contact region 3, to the n$^+$-type source region 4, to the n$^+$-type drain region 5, and to the gate 7 and provided to construct the inversion-mode lateral MOSFET.

The inversion-mode lateral MOSFET thus constructed uses the channel region formed in the surface area of the p-type base layer 2 as a current path to allow a current to flow between the n$^+$-type source region 4 and the n$^+$-type drain region 5 disposed upstream and downstream along the current path. The current flowing between the n$^+$-type source region 4 and the n$^+$-type drain region 5 can be controlled by controlling a voltage applied to the gate 7 and thereby controlling the current flowing in the channel region.

Next, a description will be given to the method of manufacturing the inversion-mode lateral MOSFET shown in FIG. 1 with reference to FIGS. 2A to 2C and 3A to 3C.

Figure 2A:
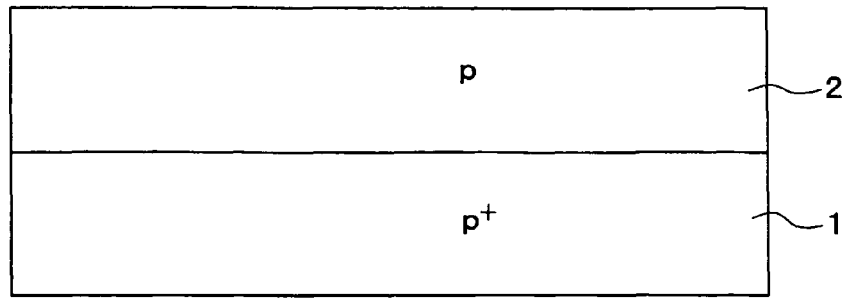
FIGS. 2A to 2C are views showing the steps of manufacturing the inversion-mode lateral MOSFET shown in FIG. 1.
Figure 2B:
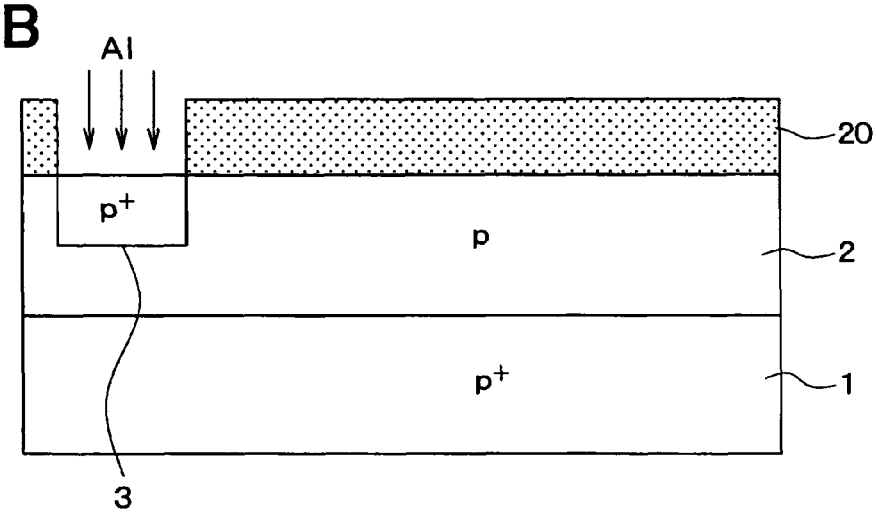

First, as shown in FIG. 2A, the semiconductor substrate composed of the p/p$^+$ substrate comprising the p$^+$-type substrate 1 and the p-type base layer 2 is prepared. Then, as shown in FIG. 2B, a LTO film 20, e.g., is deposited on the surface of the semiconductor substrate, specifically the p-type base layer 2. Subsequently, the LTO film 20 is opened over the region where the contact region 3 is to be formed through a photolithographic step. Thereafter, Al (aluminum) ions, e.g., are implanted as a p-type impurity.

Figure 2C:
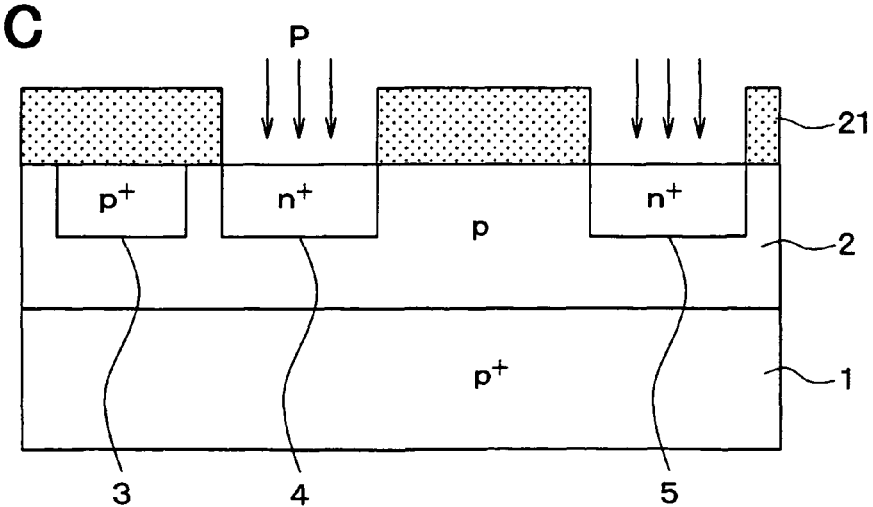

Next, after removing the LTO film 20, a LTO film 21, e.g., is deposited again, as shown in FIG. 2C. Subsequently, the LTO film 21 is opened over the regions where the n$^+$-type source region 4 and the n$^+$-type drain region 5 are to be formed through a photolithographic step. Thereafter, P (phosphorus) ions, e.g., are implanted as an n-type impurity.

Then, the LTO film 21 is removed and activation annealing is performed at, e.g., 1600° C. for 30 minutes, thereby activating the implanted p-type impurity and n-type impurity. As a result, the contact region 3, the n$^+$-type source region 4, and the n$^+$-type drain region 5 are formed.

Figure 3A:
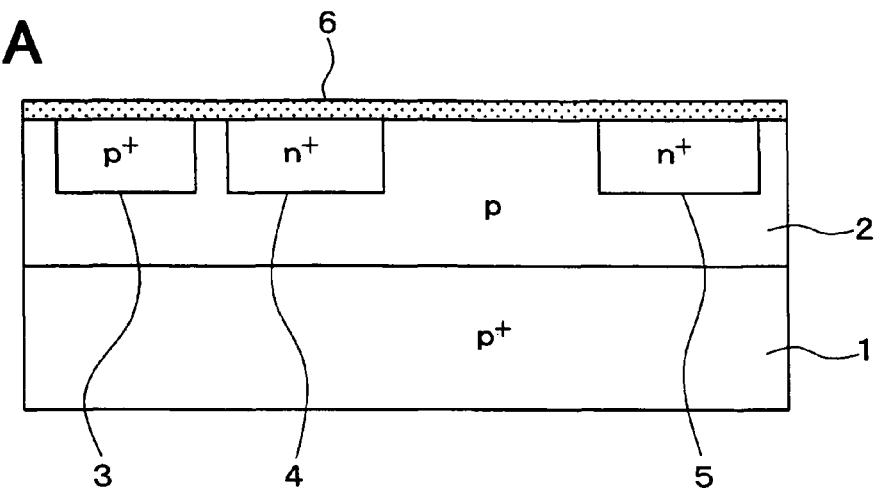
FIGS. 3A to 3C are views showing the steps of manufacturing the inversion-mode lateral MOSFET shown in FIG. 1, subsequently to FIGS. 2A to 2C.
Figure 4:
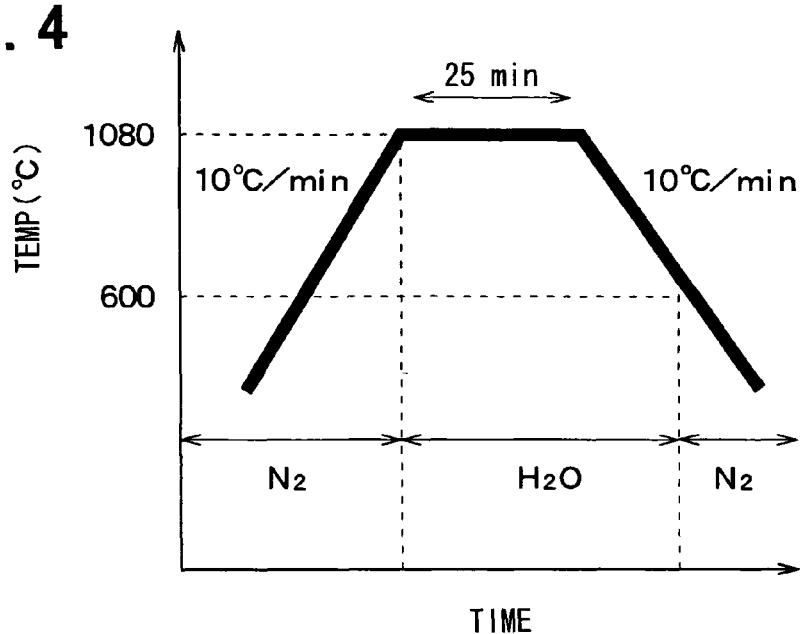
FIG. 4 is a graph showing the outline of the control of an atmosphere and a temperature in the step of forming a gate oxide film.

Subsequently, the step of forming the gate oxide film is performed to form a gate oxide film 6, as shown in FIG. 3A. Specifically, the gate oxide film 6 is formed by gate oxidation in accordance with a pyrogenic method using a wet atmosphere. At this time, the control of an atmosphere and a temperature in the step of forming the gate oxide film is performed as shown in FIG. 4.

That is, from a room temperature to 1080° C., a nitrogen (N$_2$) atmosphere is maintained and a temperature is increased at a temperature gradient of 10° C./min. When 1080° C. is reached, the nitrogen atmosphere is switched to the wet (H$_2$O) atmosphere and the temperature is held for 25 minutes, whereby the gate oxide film 6 having a thickness of, e.g., 110 nm is formed.

Thereafter, the temperature is decreased at 10° C./min, while the wet atmosphere is maintained. At this time, the wet atmosphere is maintained till the temperature decreases to a level of not more than 600° C. The temperature is not limited to 600° C. as long as it is not more than 650° C. and not more than the termination-desorption temperature.

Figure 5:
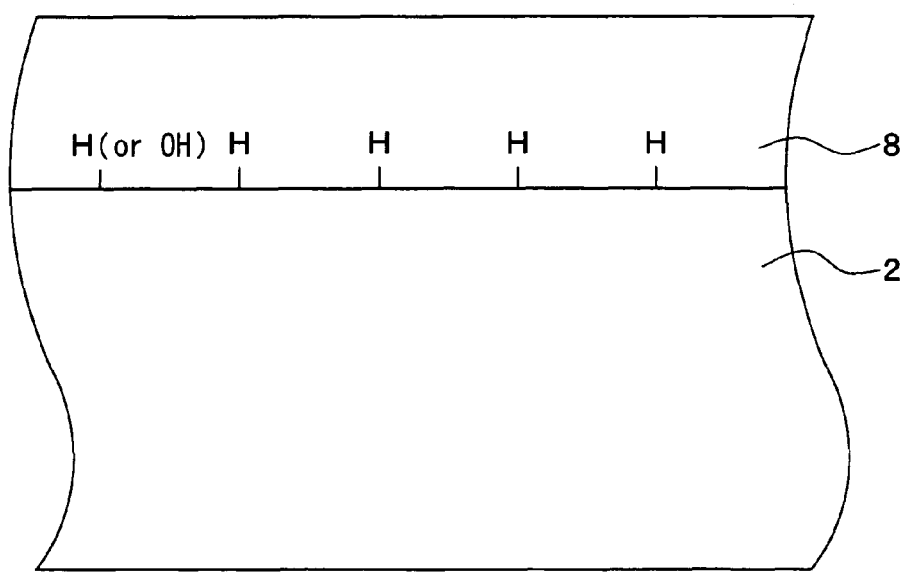
FIG. 5 is a schematic diagram showing dangling bonds at the interface between a gate oxide film 6 and a p-type base layer 2 composing a channel region which are each terminated with a H or OH element.

In this manner, the wet atmosphere is maintained during the temperature decrease period in the step of forming the gate oxide film. As a result, the interface between the gate oxide film 6 and the p-type base layer 2 composing the channel region has a structure in which dangling bonds are each terminated with a H or OH element. FIG. 5 schematically shows the termination of the dangling bonds. As shown in the drawing, a state is established in which, e.g., H or OH has entered into the gate oxide film 6 formed on the surface of the p-type base layer 2.

Figure 3B:
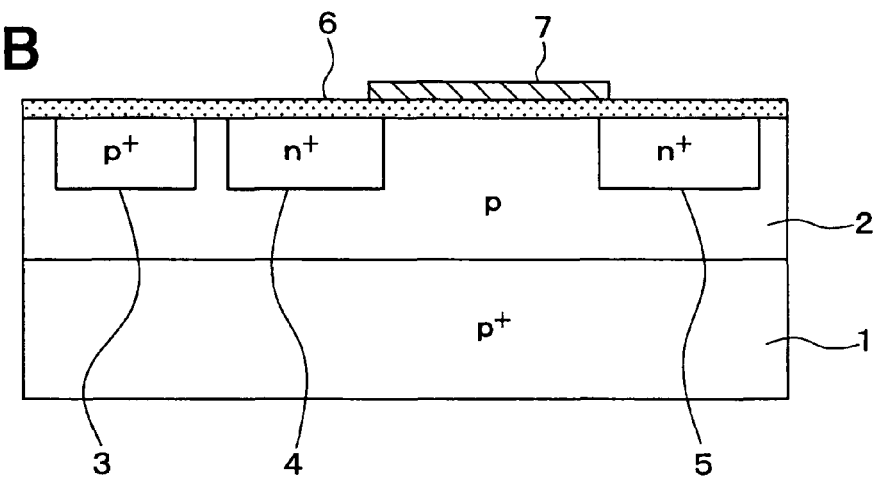

Thereafter, as shown in FIG. 3B, a polysilicon layer doped with an n-type impurity is deposited on the surface of the gate oxide film 6 at a temperature of 600° C., and then patterned using a resist not shown, thereby forming the gate 7.

Figure 3C:
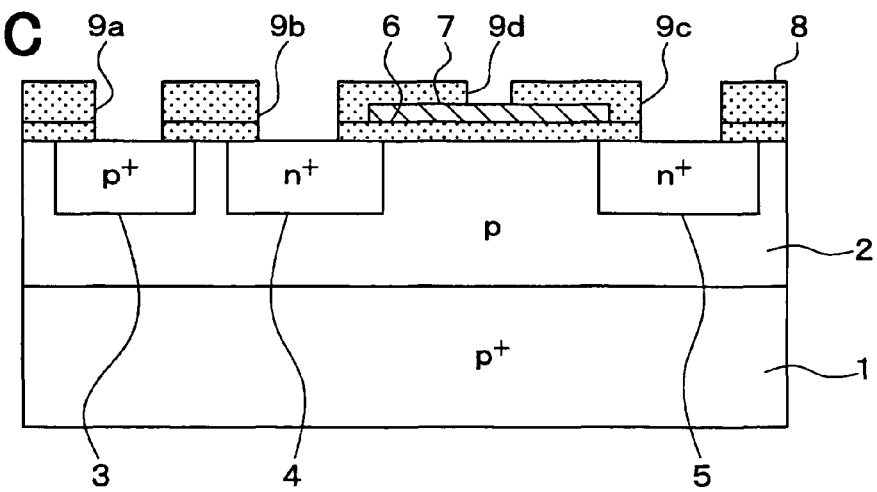

Further, as shown in FIG. 3C, the interlayer insulating film 8 made of, e.g., LTO is deposited at 420° C., and then patterned. As a result, the contact holes 9a to 9c connecting to the contact region 3, to the n$^+$-type source region 4, and to the n$^+$-type drain region 5 are formed in each of the interlayer insulating film 8 and the gate oxide film 6, while the contact hole 9d connecting to the gate 7 is formed in the interlayer insulating film 8.

Then, a Ni (nickel) film is deposited to fill the contact holes 9a to 9d, and then patterned to form the various electrodes 10 to 13. At this time, since each of the contact region 3, the n$^+$-type source region 4, and the n$^+$-type drain region 5 has a high concentration as described above, ohmic contacts are made with the various electrodes 10 to 13 even when a heat treatment step or the like is not performed. In this manner, the inversion-mode lateral MOSFET shown in FIG. 1 is completed.

In the method of manufacturing the inversion-mode lateral MOSFET described above, the temperature is decreased to a level not more than the termination-desorption temperature, while the wet atmosphere is maintained, during the temperature decrease period in the step of forming the gate oxide film, as described above. As a result, it becomes possible to terminate dangling bonds at the interface between the gate oxide film 6 and the p-type base layer 2 composing the channel region each with a H or OH element. This achieves a reduction in interface state density and allows an inversion-mode lateral MOSFET with a high channel mobility to be obtained.

In each of the step of forming the interlayer insulating film 8 and the step of forming the various electrodes 10 to 13 performed after the step of forming the gate oxide film, the temperature is controlled to be less than the H or OH termination-desorption temperature. As a result, it is possible to prevent the desorption of H or OH from each of the dangling bonds at the interface between the gate oxide film 6 and the p-type base layer 2 composing the channel region by these steps and prevent the lowering of the channel mobility due to an increase in interface state density.

Second Embodiment

The present embodiment also relates to the inversion-mode lateral MOSFET. The present embodiment is different from the first embodiment in that the method of manufacturing the inversion-mode lateral MOSFET is partly changed, and is the same as the first embodiment in terms of the structure of the inversion-mode lateral MOSFET and the like.

Figure 6:
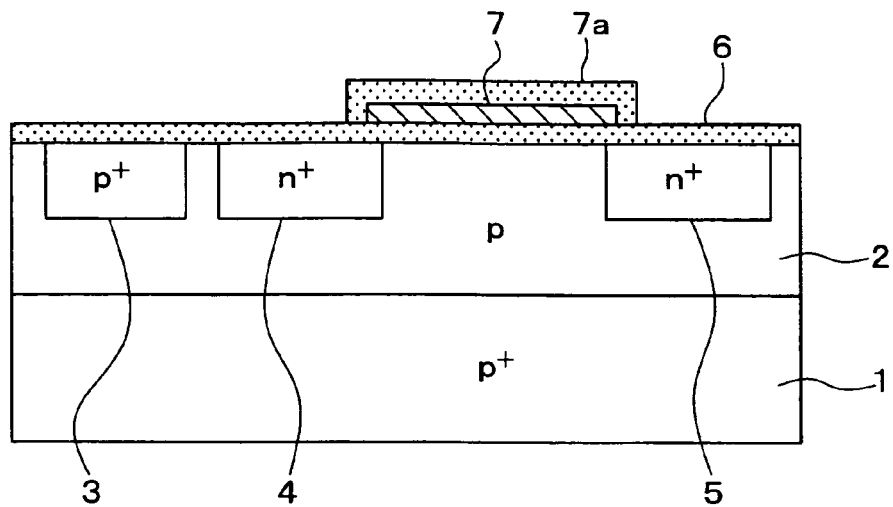
FIG. 6 is a view showing the step of manufacturing an inversion-mode lateral MOSFET according to a second embodiment.

The inversion-mode lateral MOSFET according to the present embodiment is manufactured by adding the manufacturing step shown in FIG. 6 to the method of manufacturing the inversion-mode lateral MOSFET shown in FIGS. 2A to 2C and 3A to 3C according to the first embodiment.

That is, after performing the individual steps shown in FIGS. 2A to 2C and FIGS. 3A and 3B, the process shown in FIG. 6 is performed. Thereafter, by performing the process shown in FIG. 3C and the like, the inversion-mode lateral MOSFET having the same structure as in the first embodiment is manufactured.

Specifically, in the step shown in FIG. 6, round-off oxidation for the surface of the gate 7 formed in the step shown in FIG. 3B is performed. For example, oxidation (wet oxidation) is performed for 120 minutes in a wet atmosphere at 850° C. to form an oxide film 7a on the surface of the gate 7 and round the surface of the gate 7.

Figure 7:
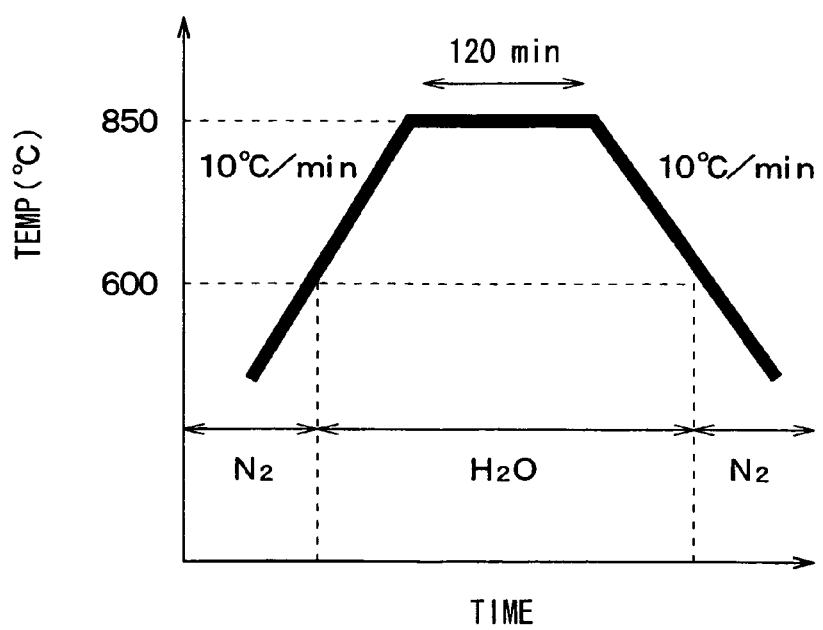
FIG. 7 is a graph showing the outline of the control of an atmosphere and a temperature of a round-off oxidation step of a gate surface.

At this time, the control of an atmosphere and a temperature for the wet oxidation is performed as shown in FIG. 7.

That is, from a room temperature to 600° C. (less than the termination-desorption temperature), a nitrogen ($N_2$) atmosphere is maintained and a temperature is increased at a temperature gradient of 10° C./min. When 600° C. is reached, the nitrogen atmosphere is switched to the wet ($H_2O$) atmosphere and the temperature is increased at the same temperature gradient to 850° C. When 850° C. is reached, the temperature is held for 120 minutes to form the oxide film 7a on the surface of the gate 7. Thereafter, the temperature is decreased at 10° C./min, while the wet atmosphere is maintained. At this time, the wet atmosphere is maintained till the temperature decreases to 600° C. and, when 600° C. is reached, the atmosphere is switched again from the wet atmosphere to the nitrogen atmosphere and the temperature is decreased to the room temperature. The temperature at which the maintenance of the wet atmosphere is started and stopped is not limited to 600° C. Any temperature is appropriate provided that it is not more than 650° C. and not more than the termination-desorption temperature.

Thus, the wet atmosphere is maintained when the temperature becomes not less than the termination-desorption temperature in the round-off oxidation for the gate 7. As a result, it is possible to prevent the desorption of a H or OH element from each of the dangling bonds at the interface between the gate oxide film 6 and the p-type base layer 2 composing the channel region.

Accordingly, when a heat treatment is performed at a high temperature after the step of forming the gate oxide film as in the present embodiment also, an increase in interface state density can be prevented by establishing the wet atmosphere when the temperature becomes not less than the termination-desorption temperature.

Third Embodiment

The present embodiment also relates to the inversion-mode lateral MOSFET. The present embodiment is different from the first or second embodiment in that the method of manufacturing the inversion-mode lateral MOSFET is partly changed, and is the same as the first or second embodiment in terms of the structure of the inversion-mode lateral MOSFET and the like.

The inversion-mode lateral MOSFET according to the present embodiment is manufactured by changing the step of forming the interlayer insulating film 8 shown in FIG. 3C of the method of manufacturing the inversion-mode lateral MOSFET shown in FIGS. 2A to 2C and 3A to 3C (and FIG. 6) described above to the step shown in FIGS. 8A and 8B.

That is, by performing the individual steps shown in FIGS. 2A to 2C and FIGS. 3A and 3B (or further performing the process shown in FIG. 6) and subsequently performing the process shown in FIGS. 8A and 8B, instead of the process shown in FIG. 3C, the inversion-mode lateral MOSFET having the same structure as in the first or second embodiment is manufactured.

Figure 8A:
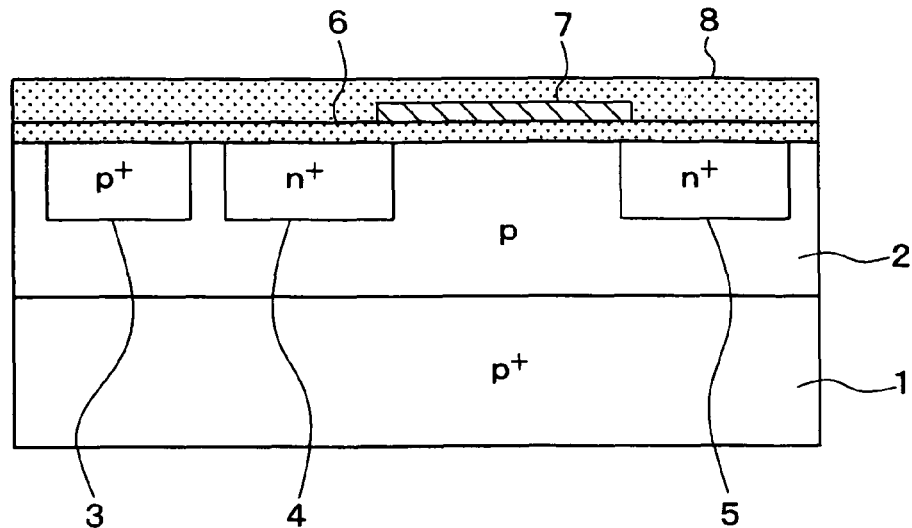
FIGS. 8A and 8B are views showing the steps of manufacturing an inversion-mode lateral MOSFET according to a third embodiment.
Figure 8B:
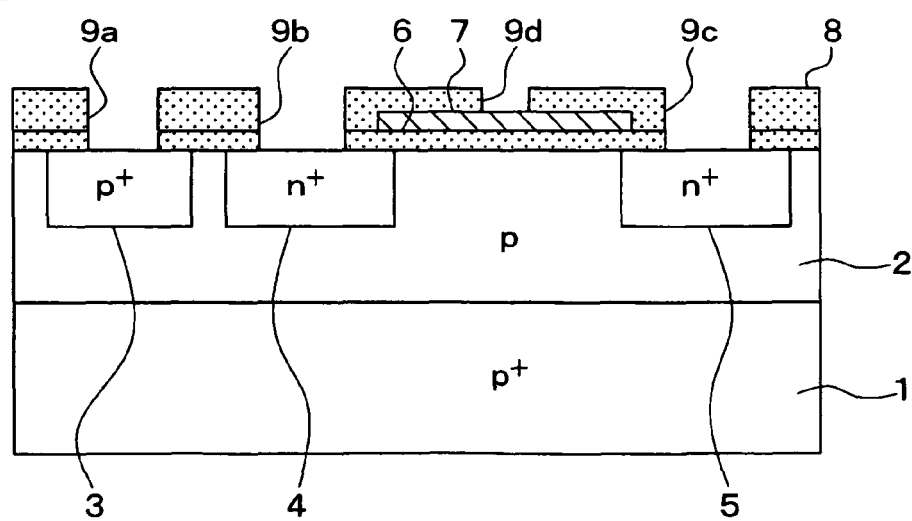

Specifically, in the step shown in FIG. 8A, the interlayer insulating film 8 is deposited on the surfaces of the gate 7 and the gate oxide film 6 formed in the step shown in FIG. 3B (or on the surfaces of an oxide film 7a and the gate oxide film 6 formed in the step shown in FIG. 6). Then, as shown in FIG. 8B, the contact holes 9a to 9d are formed in the intermediate insulating film 8 and the gate oxide film 6.

Figure 9:
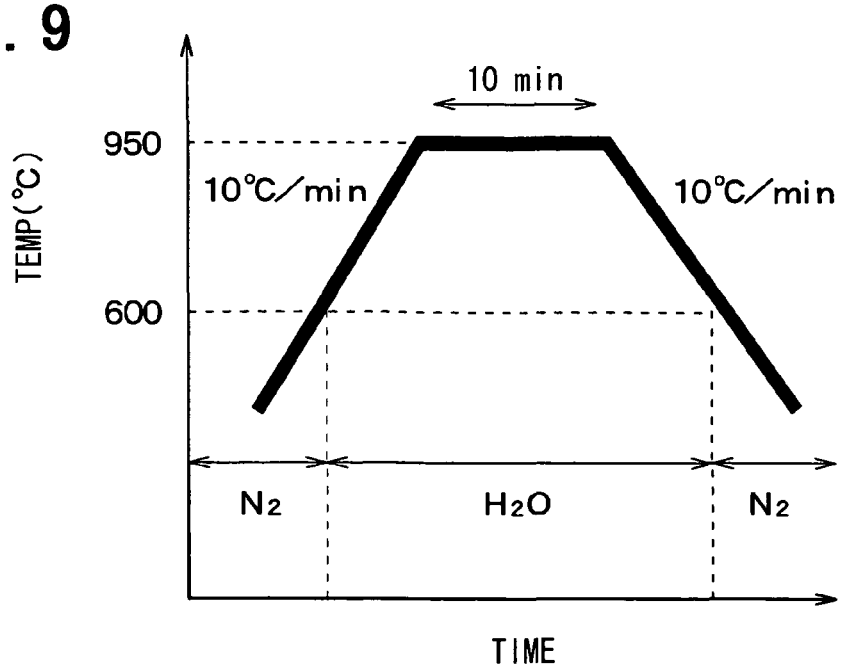
FIG. 9 is a graph showing the outline of the control of an atmosphere and a temperature in a reflow step for an interlayer insulating film.

At this time, in the step shown in FIG. 8A, a BPSG film is deposited by, e.g., plasma CVD at 420° C. Thereafter, a reflow process is performed for 10 minutes in a wet atmosphere at 950° C. to form the interlayer insulating film 8. At this time, the control of an atmosphere and a temperature for the wet oxidation is performed as shown in FIG. 9.

That is, from a room temperature to 600° C. (less than the termination-desorption temperature), a nitrogen ($N_2$) atmosphere is maintained and a temperature is increased at a temperature gradient of 10° C./min. When 600° C. is reached, the nitrogen atmosphere is switched to the wet ($H_2O$ atmosphere) and the temperature is increased at the same temperature gradient to 950° C. When 950° C. is reached, the reflow process is performed by holding the temperature for 10 minutes. Thereafter, the temperature is decreased at 10° C./min, while the wet atmosphere is maintained. At this time, the wet atmosphere is maintained till the temperature decreases to 600° C. and, when 600° C. is reached, the atmosphere is switched again from the wet atmosphere to the nitrogen atmosphere and the temperature is decreased to the room temperature. The temperature at which the maintenance of the wet atmosphere is started and stopped is not limited to 600° C. Any temperature is appropriate provided that it is not more than 650° C. and not more than the termination-desorption temperature. In accordance with another method, a hydrogen atmosphere may also be established appropriately in stead of the wet atmosphere. In that case also, from the room temperature to 600° C. (less than the termination-desorption temperature), the nitrogen ($N_2$) atmosphere is maintained and the temperature is increased at a temperature gradient of 10° C./min. When 600° C. is reached, the nitrogen atmosphere is switched to the hydrogen atmosphere and the temperature is increased at the same temperature gradient to 950° C. When 950° C. is reached, the reflow process is performed by holding the temperature for 10 minutes. Thereafter, the temperature is decreased at 10° C./min, while the hydrogen atmosphere is maintained. At this time, the hydrogen atmosphere is maintained till the temperature decreases to 600° C. and, when 600° C. is reached, the atmosphere is switched again from the hydrogen atmosphere to the nitrogen atmosphere and the temperature is decreased to the room temperature. The temperature at which the hydrogen annealing is started and stopped is not limited to 600° C. Any temperature is appropriate provided that it is not more than 650° C. and not more than the termination-desorption temperature.

Thus, the wet atmosphere or the hydrogen atmosphere is maintained when the temperature becomes not less than the termination-desorption temperature in the reflow process for the interlayer insulating film 8. As a result, it is possible to prevent the desorption of H or OH from the dangling bonds at the interface between the gate oxide film 6 and the p-type base layer 2 composing the channel region.

Accordingly, even when a heat treatment is performed at a high temperature after the step of forming the gate oxide film as in the present embodiment, an increase in interface state density can be prevented by establishing the wet atmosphere or the hydrogen atmosphere when the temperature becomes not less than the termination-desorption temperature.

Fourth Embodiment

Figure 10:
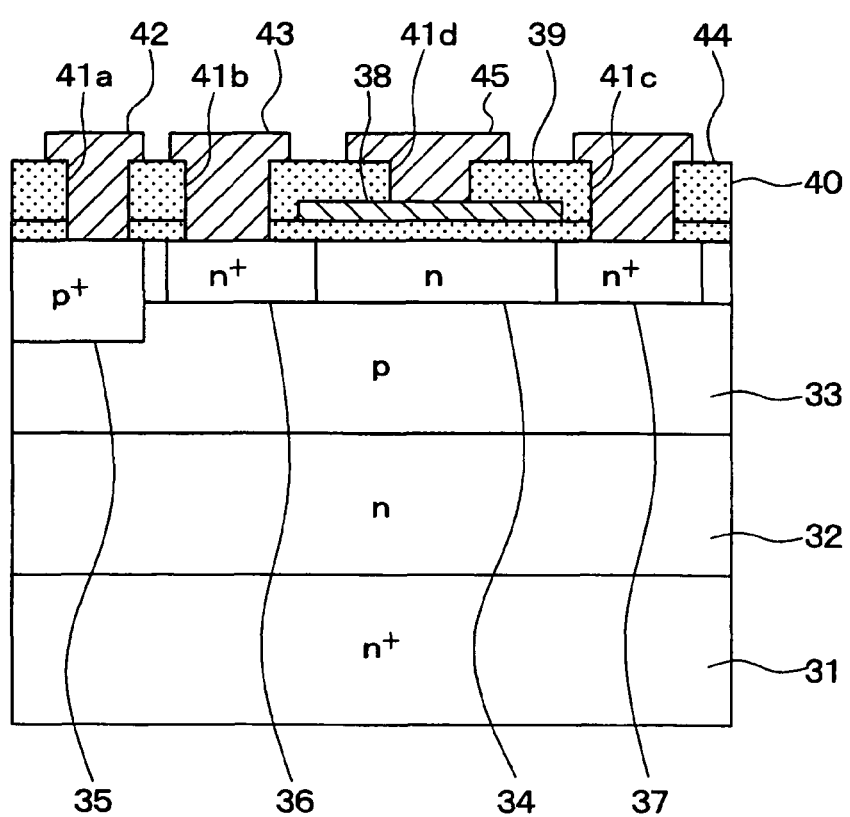
FIG. 10 is a view showing a cross-sectional structure of an accumulation-mode lateral MOSFET according to a fourth embodiment.

The present embodiment relates to an accumulation-mode lateral MOSFET. FIG. 10 shows a cross-sectional structure of the accumulation-mode lateral MOSFET, while FIGS. 11A to 11D through 13A to 13C show the steps of manufacturing the accumulation-mode lateral MOSFET shown in FIG. 10. Referring to these drawings, the structure and manufacturing method of the accumulation-mode lateral MOSFET according to the present embodiment will be described.

As shown in FIG. 10, the accumulation-mode lateral MOSFET is formed in an n+-type substrate 31 made of SiC having a principal surface on one side thereof. As the n+-type substrate 31, a substrate made of, e.g., 4H—SiC, having a (000-1) C face as the principal surface, and having an impurity concentration of about $5\times10^{18}$ cm$^{-3}$ is used.

In the principal surface of the substrate 31, an n-type drift layer 32 made of epitaxially grown SiC is formed. For example, the n-type drift layer 32 has an impurity concentration of about $1\times10^{16}$ cm$^{-3}$ and a thickness of 10 μm.

In a surface area of the n-type drift layer 32, a p-type base layer 33 is formed. For example, the p-type base layer 33 is at about $1\times10^{19}$ cm$^{-3}$ and has a depth of 0.7 μm.

On the p-type base layer 33, an n-type channel layer (hereinafter referred to as a channel epitaxial layer) 34 for composing an epitaxially grown channel region is formed. For example, the channel epitaxial layer 34 has a concentration of about $1\times10^{16}$ cm$^{-3}$ and a film thickness (depth) of 0.3 μm.

A p+-type contact region 35 is formed to extend through the channel epitaxial layer 34 and reach the p-type base layer 33. For example, the contact region 35 has a high concentration of not less than $3\times10^{20}$ cm$^{-3}$ and a depth of 0.4 μm.

On both sides of the channel epitaxial layer 34, an n+-type source region 36 and an n+-type drain region 37 are formed to be spaced apart from the contact region 35 such that the channel epitaxial layer 34 is interposed therebetween. The n+-type source region 36 and the n+-type drain region 37 are formed to be spaced apart from each other. Each of the n+-type source region 36 and the n+-type drain region 37 has a high concentration of, e.g., not less than $3\times10^{20}$ cm$^{-3}$ and a depth of 0.3 μm.

A gate oxide film 38 having a thickness of, e.g., 38 nm and using the portion of the surface area of the channel epitaxial layer 34 interposed between the n+-type source region 36 and the n+-type drain region 37 as a channel region is formed so as to cover at least the surface of the channel region. The interface between the gate oxide film 38 and the channel epitaxial layer 34 composing the channel region has a structure in which dangling bonds are each terminated with a H or OH element.

On the surface of the gate oxide film 38, a gate 39 made of polysilicon doped with, e.g., an n-type impurity (e.g., P (phosphorus)) is formed through patterning.

To cover the gate 39 and the other portion of the gate oxide film 38, an interlayer insulating film 40 made of, e.g., LTO is formed. Contact holes 41a to 41c connecting to the contact region 35, to the n+-type source region 36, and to the n+-type drain region 37 are formed in each of the interlayer insulating film 40 and the gate oxide film 38, while a contact hole 41d connecting to the gate 39 is formed in the interlayer insulating film 40.

Through the respective contact holes 41a to 41d, a base electrode 42 for fixing a potential, a source electrode 43, a drain electrode 44, and a gate electrode 45 are electrically connected to the contact region 35, to the n+-type source region 36, to the n+-type drain region 37, and to the gate 39 and provided to construct the accumulation-mode lateral MOSFET.

The accumulation-mode lateral MOSFET thus constructed uses the channel epitaxial layer 34, i.e., the channel region as a current path to allow a current to flow between the n+-type source region 36 and the n+-type drain region 37 disposed upstream and downstream along the current path. The current flowing between the n+-type source region 36 and the n+-type drain region 37 can be controlled by controlling a voltage applied to the gate 39, controlling the width of a depletion layer formed in the channel region, and thereby controlling the current allowed to flow therein.

Next, a description will be given to the method of manufacturing the accumulation-mode lateral MOSFET shown in FIG. 10 with reference to FIGS. 11A to 11D through 13A to 13C.

Figure 11A:
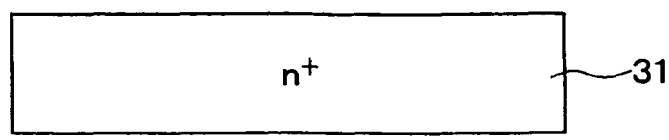
FIGS. 11A to 11D are views showing the steps of manufacturing the accumulation-mode lateral MOSFET shown in FIG. 10.
Figure 11B:
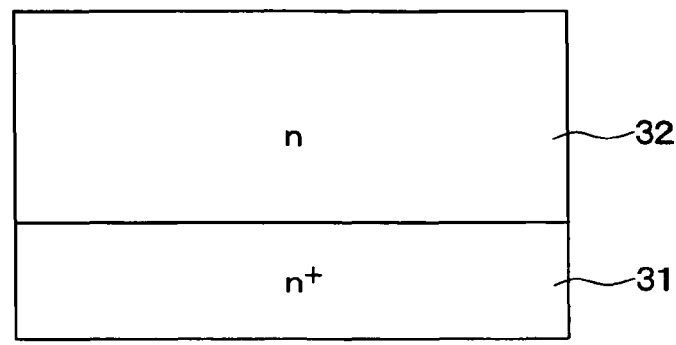

First, as shown in FIG. 11A, the n+-type substrate 31 is prepared and, as shown in FIG. 11B, the n-type drift layer 32 is epitaxially grown on the principal surface of the substrate 31 to have an impurity concentration of about $1\times10^{16}$ cm$^{-3}$ and a thickness of 10 μm.

Figure 11C:
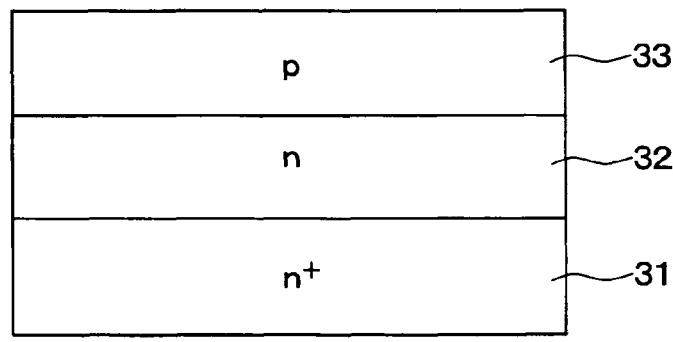
Figure 11D:
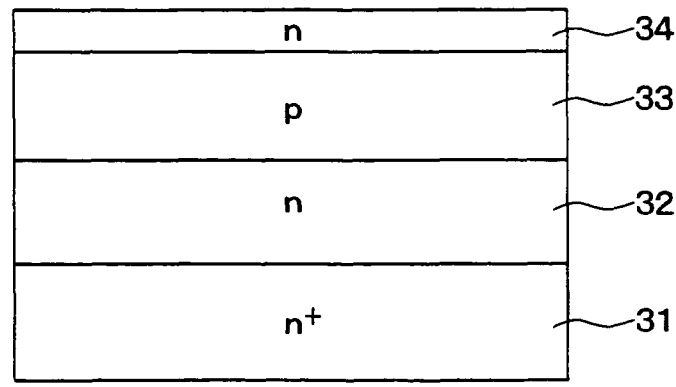

Thereafter, as shown in FIG. 11C, Al ions are implanted as a p-type impurity into the surface area of the n-type drift layer 32 and then activation annealing is performed at 1600° C. for 30 minutes to form the p-type base layer 33 having an impurity concentration of, e.g., about $1\times10^{19}$ cm$^{-3}$ and a depth of 0.7 μm. Then, as shown in FIG. 11D, the channel epitaxial layer 34 having an impurity concentration of, e.g., about $1\times10^{16}$ cm$^{-3}$ and a film thickness (depth) of 0.3 μm is epitaxially grown on the p-type base layer 33.

Figure 12A:
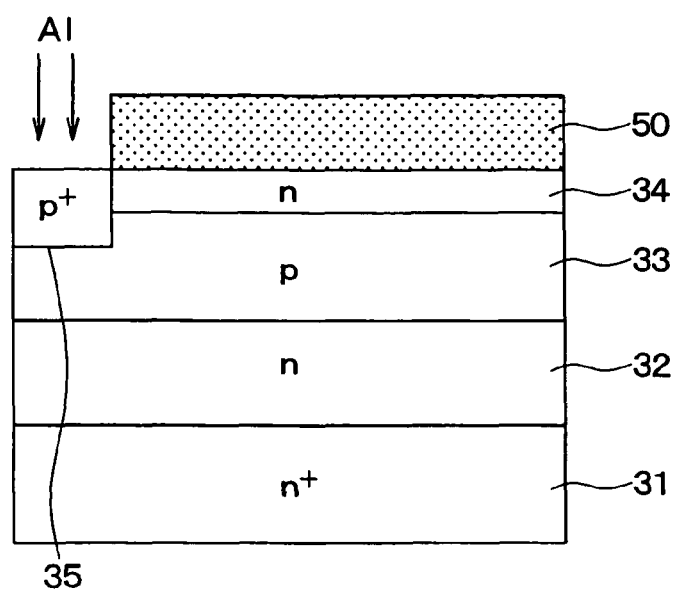
FIGS. 12A to 12C are views showing the steps of manufacturing the accumulation-mode lateral MOSFET, subsequently to FIGS. 11A to 11D.

Subsequently, as shown in FIG. 12A, a LTO film 50, e.g., is deposited. Then, the LTO film 50 is opened over the region where the contact region 35 is to be formed through a photolithographic step. Then, Al ions are implanted by using the LTO film 50 as a mask.

Figure 12B:
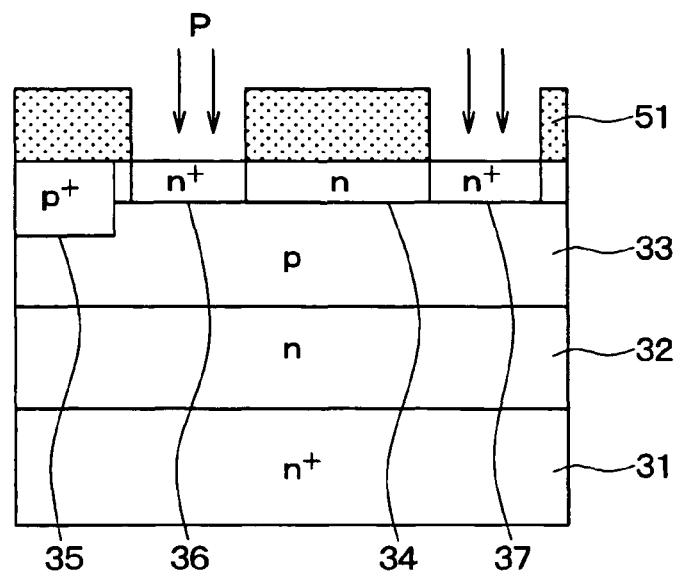

Next, after removing the LTO film 50, a LTO film 51, e.g., is deposited again, as shown in FIG. 12B. Subsequently, the LTO film 51 is opened over the regions where the n+-type source region 36 and the n+-type drain region 37 are to be formed through a photolithographic step. Thereafter, P (phosphorus) ions are implanted as an n-type impurity.

Then, the LTO film 51 is removed and activation annealing is performed at, e.g., 1600° C. for 30 minutes, thereby activating the implanted p-type impurity and n-type impurity. As a result, the contact region 35, the n+-type source region 36, and the n+-type drain region 37 are formed.

Figure 12C:
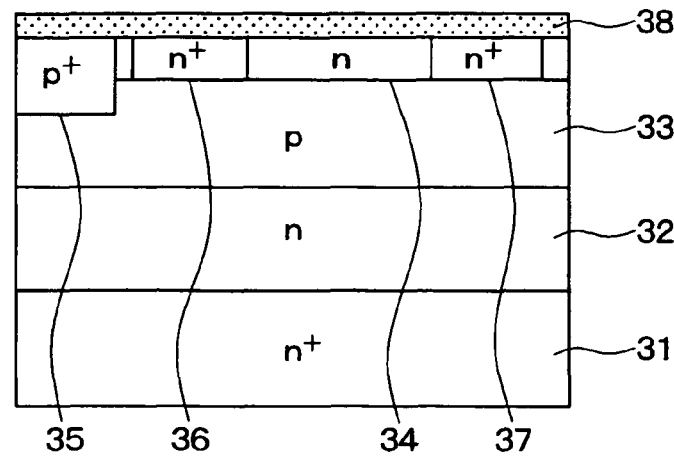

Subsequently, the step of forming the gate oxide film is performed to form the gate oxide film 38, as shown in FIG. 12C. Specifically, the gate oxide film 38 is formed by gate oxidation in accordance with a pyrogenic method using a wet atmosphere. At this time, the control of an atmosphere and a temperature in the step of forming the gate oxide film is performed as shown in FIG. 4 according to the first embodiment.

That is, from a room temperature to 1080° C., a nitrogen ($N_2$) atmosphere is maintained and a temperature is increased at a temperature gradient of 10° C./min. When 1080° C. is reached, the nitrogen atmosphere is switched to the wet ($H_2O$) atmosphere and the temperature is held for 60 minutes, whereby the gate oxide film 38 having a thickness of, e.g., 110 nm is formed. Thereafter, the temperature is decreased at 10° C./min, while the wet atmosphere is maintained. At this time, the wet atmosphere is maintained till the temperature decreases to a level of not more than 600° C.

In this manner, the wet atmosphere is maintained during the temperature decrease period in the step of forming the gate oxide film. As a result, the interface between the gate oxide film 38 and the channel epitaxial layer 34 composing the channel region has a structure in which dangling bonds are each terminated with a H or OH element.

Figure 13A:
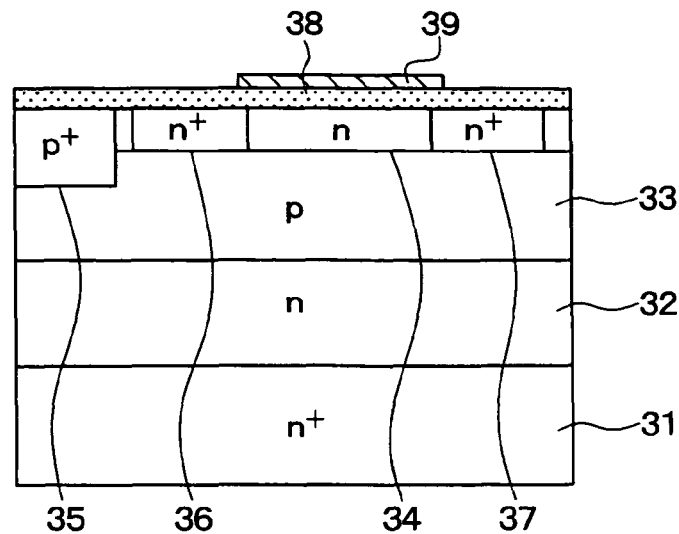
FIGS. 13A to 13C are views showing the steps of manufacturing the accumulation-mode lateral MOSFET, subsequently to FIGS. 12A to 12C.

Thereafter, as shown in FIG. 13A, a polysilicon layer doped with an n-type impurity is deposited on the surface of the gate oxide film 38 at a temperature of 600° C., and then patterned using a resist not shown, thereby forming the gate 39.

Figure 13B:
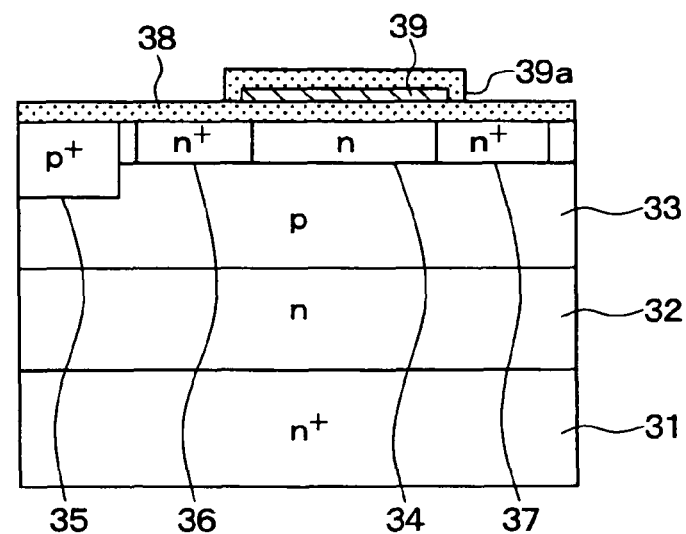

Further, as shown in FIG. 13B, round-off oxidation for the surface of the gate 39 is performed. For example, oxidation (wet oxidation) is performed for 120 minutes in a wet atmosphere at 850° C. to form an oxide film 39a on the surface of the gate 39 and round the surface of the gate 39.

At this time, the control of an atmosphere and a temperature for the wet oxidation is performed as shown in FIG. 7 according to the second embodiment to maintain the wet atmosphere when the temperature becomes not less than the termination-desorption temperature. As a result, it is possible to prevent the desorption of H or OH from the dangling bonds at the interface between the gate oxide film 38 and the channel epitaxial layer 34.

Figure 13C:
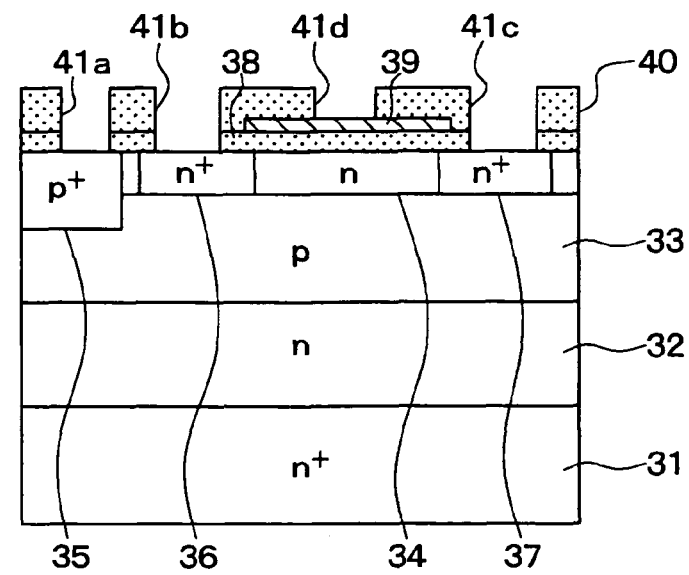

Subsequently, as shown in FIG. 13C, the interlayer insulating film 40 is deposited. For example, the interlayer insulating film 40 is formed by depositing a BPSG film at 420° C. by plasma CVD and then performing a 10-minute reflow process in a wet atmosphere at 950° C. At this time, the control of an atmosphere and a temperature for the wet oxidation is performed as shown in FIG. 9 according to the third embodiment to maintain the wet atmosphere when the temperature becomes not less than the termination-desorption temperature in the reflow process for the interlayer insulating film 40. As a result, it is possible to prevent the desorption of H or OH from the dangling bonds at the interface between the gate oxide film 38 and the channel epitaxial layer 34.

Thereafter, the interlayer insulating film 40 is patterned so that the contact holes 41a to 41c connecting to the contact region 35, to the n+-type source region 36, and to the n+-type drain region 37 are formed in each of the interlayer insulating film 40 and the gate oxide film 38, while the contact hole 41d connecting to the gate 39 is formed in the interlayer insulating film 40.

Then, a Ni film is deposited to fill the contact holes 41a to 41d, and then patterned to form the various electrodes 42 to 45. At this time, since each of the contact region 35, the n+-type source region 36, and the n+-type drain region 37 has a high concentration as described above, ohmic contacts are made with the various electrodes 42 to 45 even when a heat treatment step or the like is not performed. In this manner, the accumulation-mode lateral MOSFET shown in FIG. 10 is completed.

In the method of manufacturing the accumulation-mode lateral MOSFET described above, the temperature is decreased to a level not more than the termination-desorption temperature, while the wet atmosphere is maintained, during the temperature decrease period in the step of forming the gate oxide film, as described above. As a result, it becomes possible to terminate the dangling bonds at the interface between the gate oxide film 38 and the channel epitaxial layer 34 each with a H or OH element. This achieves a reduction in interface state density and allows an accumulation-mode lateral MOSFET with a high channel mobility to be obtained.

In addition, when the temperature becomes not less than the termination-desorption temperature in the round-off oxidation for the gate 39, the wet atmosphere is maintained. As a result, it is possible to prevent the desorption of H or OH from the dangling bonds at the interface between the gate oxide film 38 and the channel epitaxial layer 34.

Further, when the temperature becomes not less than the termination-desorption temperature in the reflow process for the interlayer insulating film 40, the wet atmosphere is maintained. As a result, it is possible to prevent the desorption of H or OH from the dangling bonds at the interface between the gate oxide film 38 and the channel epitaxial layer 34.

Accordingly, even when a heat treatment is performed at a high temperature after the step of forming the gate oxide film as in the present embodiment, an increase in interface state density can be prevented by establishing the wet atmosphere when the temperature becomes not less than the termination-desorption temperature.

Fifth Embodiment

Figure 14:
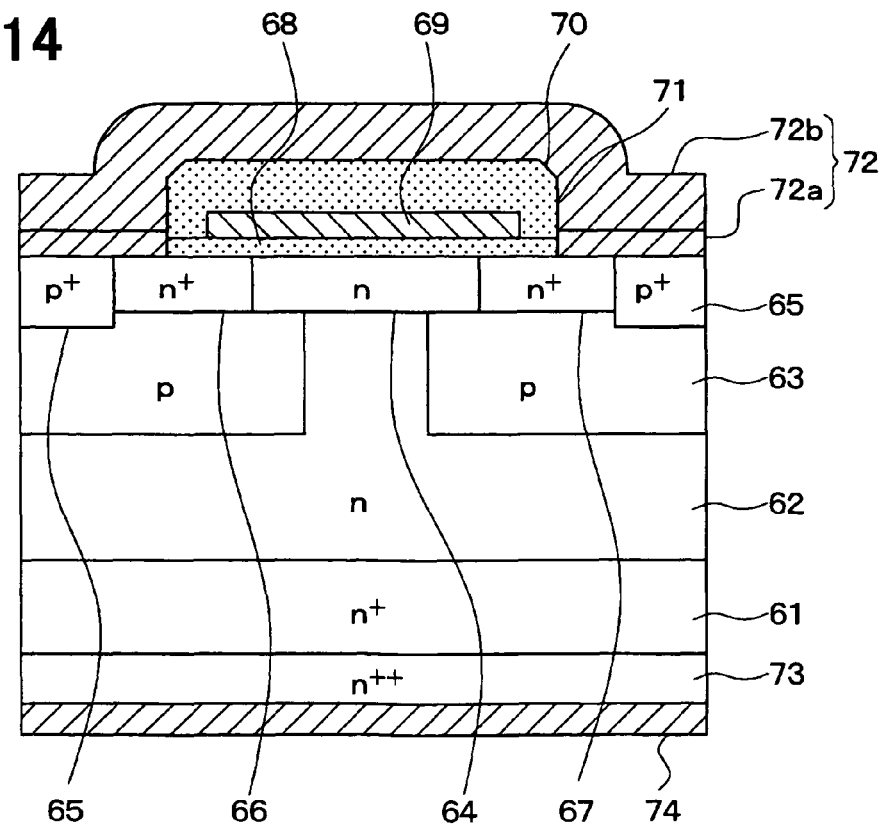
FIG. 14 is a view showing a cross-sectional structure of a planar MOSFET according to a fifth embodiment.

The present embodiment relates to a planar MOSFET. FIG. 14 shows a cross-sectional structure of the planar MOSFET, while FIGS. 15A to 15D through 19A to 19C show the steps of manufacturing the planar MOSFET shown in FIG. 14. Referring to these drawings, the structure and manufacturing method of the planar MOSFET according to the present embodiment will be described.

As shown in FIG. 14, the planar MOSFET is formed on an n+-type substrate 61 made of SiC having a principal surface on one side thereof. As the n+-type substrate 61, a substrate made of, e.g., 4H—SiC, having a (000-1) C face as the principal surface, and having an impurity concentration of about $5\times10^{18}$ cm$^{-3}$ is used.

On the principal surface of the substrate 61, an n-type drift layer 62 made of epitaxially grown SiC is formed. For example, the n-type drift layer 62 has an impurity concentration of about $1\times10^{16}$ cm$^{-3}$ and a thickness of 10 μm.

In a surface area of the n-type drift layer 62, a plurality of p-type base regions 63 are formed to be arranged with specified spacings therebetween. For example, each of the p-type base regions 63 has a concentration of $1\times10^{19}$ cm$^{-3}$ and a depth of 0.7 μm.

Over the p-type base regions 63, an n-type channel layer (hereinafter referred to as a channel epitaxial layer) 64 for composing an epitaxially grown channel region is formed. For example, the channel epitaxial layer 64 has a concentration of, e.g., $1\times10^{16}$ cm$^{-3}$ and a film thickness (depth) of 0.3 μm.

P+-type contact regions 65 are formed to extend through the channel epitaxial layer 64 and reach the p-type base regions 63. For example, each of the contact regions 65 has a high concentration of not less than $3\times10^{20}$ cm$^{-3}$ and a depth of 0.4 μm.

On both sides of the channel epitaxial layer 64, n+-type source regions 66 and 67 are formed inwardly of the contact regions 65 such that the channel epitaxial layer 64 is interposed therebetween. The n+-type source regions 66 and 67 are formed to be spaced apart from each other. Each of the n+-type source regions 66 and 67 has a high concentration of, e.g., not less than $3\times10^{20}$ cm$^3$ and a depth of 0.3 μm.

A gate oxide film 68 having a thickness of, e.g., 110 nm and using the portion of the surface area of the channel epitaxial layer 64 located over the p-type base regions 63 as a channel region is formed so as to cover at least the surface of the channel region. The interface between the gate oxide film 68 and the channel epitaxial layer 64 composing the channel region has a structure in which dangling bonds are each terminated with a H or OH element.

On the surface of the gate oxide film 68, a gate 69 made of polysilicon doped with, e.g., an n-type impurity (e.g., P (phosphorus)) is formed through patterning.

To cover the gate 69 and the other portion of the gate oxide film 68, an interlayer insulating film 70 made of, e.g., BPSG is formed. A contact hole 71 connecting to the contact regions 65 and to the n+-type source regions 66 and 67 and a contact hole connecting to the gate 69, which is not shown, are formed in each of the interlayer insulating film 70 and the gate oxide film 68. There is also provided a source electrode 72 constructed by a contact portion 72a electrically connected to each of the contact regions 65 and the n$^+$-type source regions 66 and 67 via the contact hole 71 and by a wiring electrode 72b made of Al.

On the other hand, on the back surface of the substrate 61, an n$^+$-type drain contact region 73 at a concentration higher than that of the substrate 61 is formed. On the drain contact region 73, a drain electrode 74 serving as a back electrode made of, e.g., Ni is formed. By such a structure, the planar MOSFET is constructed.

The planar-mode MOSFET thus constructed uses the channel epitaxial layer 64, i.e., the channel region as a current path to allow a current to flow between the n$^+$-type source regions 66 and 67 disposed upstream and downstream along the current path and the drain contact region 73. The current flowing between the n$^+$-type source regions 66 and 67 and the drain contact region 73 can be controlled by controlling a voltage applied to the gate 69, controlling the width of a depletion layer formed in the channel region, and thereby controlling the current allowed to flow therein.

Next, a description will be given to the method of manufacturing the planar MOSFET shown in FIG. 14 with reference to FIGS. 15A to 15D through 19A to 19C.

Figure 15A:
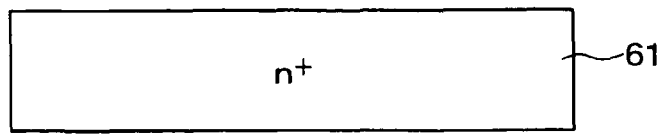
FIGS. 15A to 15D are views showing the steps of manufacturing the planar MOSFET shown in FIG. 14.
Figure 15B:
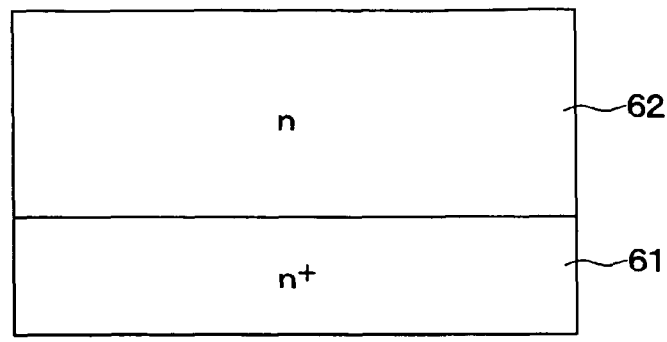

First, as shown in FIG. 15A, the n$^+$-type substrate 61 is prepared and, as shown in FIG. 15B, the n-type drift layer 62 is epitaxially grown on the principal surface of the substrate 61 to have an impurity concentration of about $1 \times 10^{16}$ cm$^{-3}$ and a thickness of 10 μm.

Figure 15C:
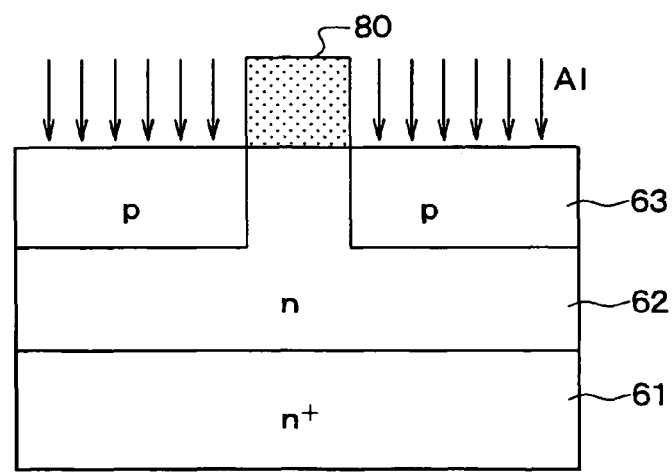
Figure 15D:
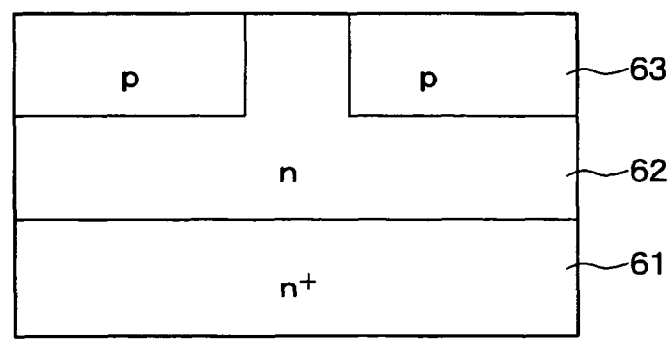

Thereafter, as shown in FIG. 15C, a LTO film 80, e.g., is deposited. Then, the LTO film 80 is opened over the regions where the p-type base regions 63 are to be formed through a photolithographic step. Then, Al ions are implanted into the surface area of the n-type drift layer 62 by using the LTO film 80 as a mask. Subsequently, as shown in FIG. 15D, the LTO film 80 is removed and activation annealing is performed at 1600° C. for 30 minutes to form the p-type base regions 63 having, e.g., an impurity concentration of about $1 \times 10^{19}$ cm$^{-3}$ and a depth of 0.7 μm.

Figure 16A:
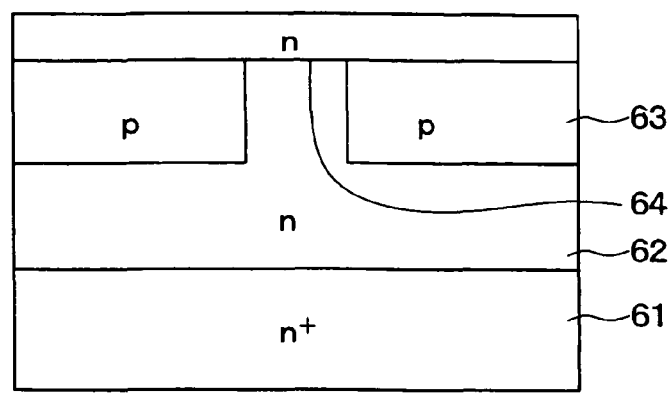
FIGS. 16A to 16C are views showing the steps of manufacturing the planar MOSFET, subsequently to FIG. 15A to 15D.

Subsequently, as shown in FIG. 16A, the channel epitaxial layer 64 having, e.g., a concentration of about $1 \times 10^{16}$ cm$^{-3}$ and a film thickness (depth) of 0.3 μm is epitaxially grown over the p-type base regions 63.

Figure 16B:
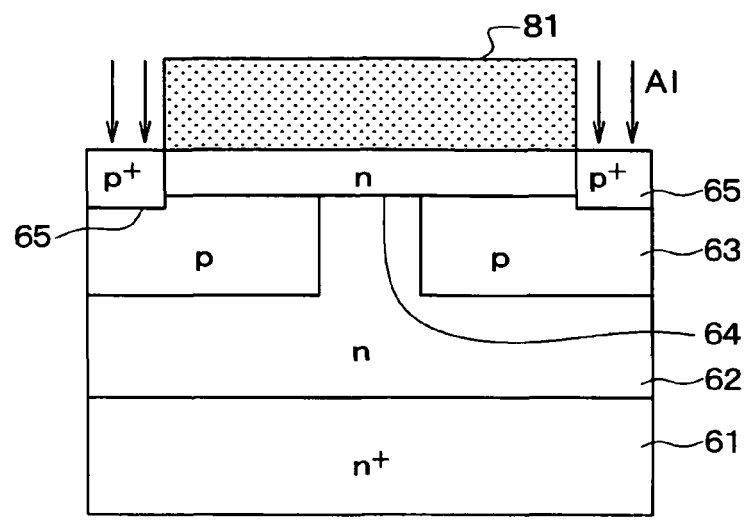

Then, as shown in FIG. 16B, an LTO film 81, e.g., is deposited and opened over the regions where the contact regions 65 are to be formed through a photolithographic step. Thereafter, Al ions are implanted by using the LTO film 81 as a mask.

Figure 16C:
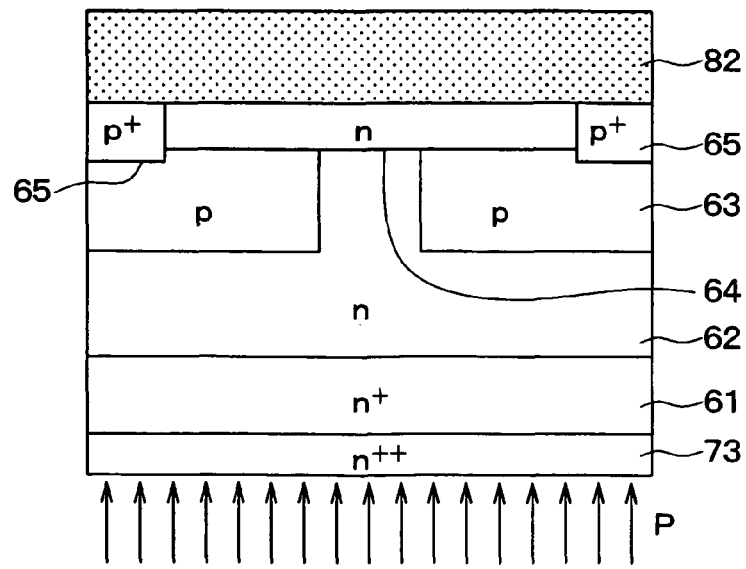

After removing the LTO film 81, a LTO film 82, e.g., is deposited to protect the substrate surface, and then P ions are implanted from the back surface of the substrate 61, as shown in FIG. 16C.

Figure 17A:
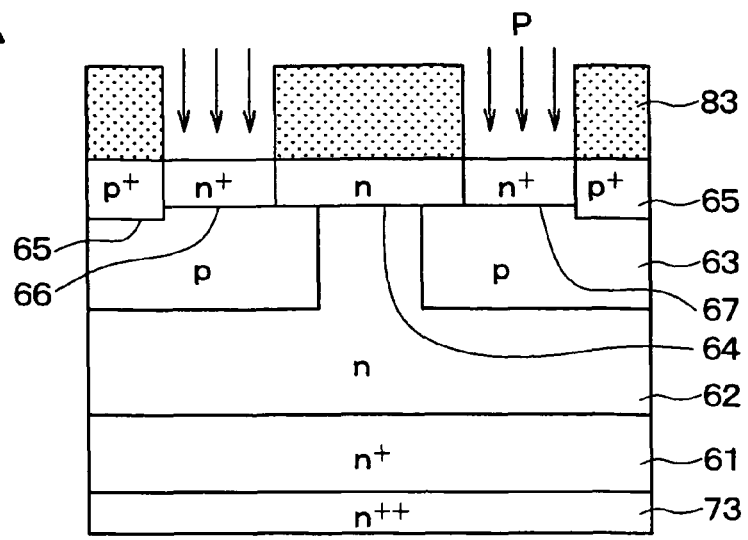
FIGS. 17A to 17C are views showing the steps of manufacturing the planar MOSFET, subsequently to FIGS. 16A to 16C.

After further removing the LTO film 82, a LTO film 83, e.g., is deposited and opened over the regions where the n$^+$-type source regions 66 and 67 are to be formed through a photolithographic step, as shown in FIG. 17A. Thereafter, P ions are implanted as an n-type impurity.

Figure 17B:
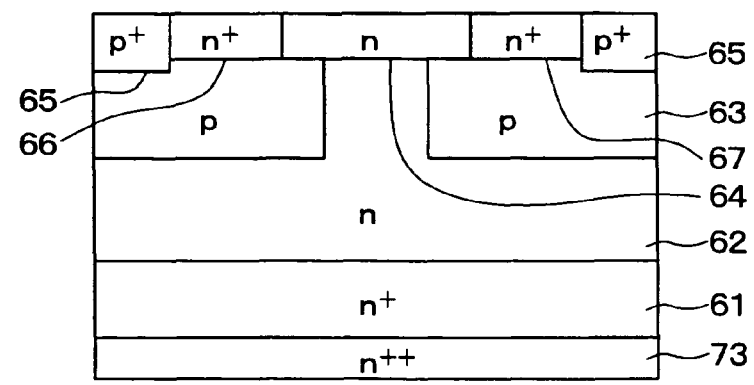

Then, as shown in FIG. 17B, the LTO film 83 is removed and then activation annealing is performed at, e.g., 1600° C. for 30 minutes, thereby activating the implanted p-type impurity and n-type impurity. As a result, the contact regions 65 and the n$^+$-type source regions 66 and 67 are formed.

Figure 17C:
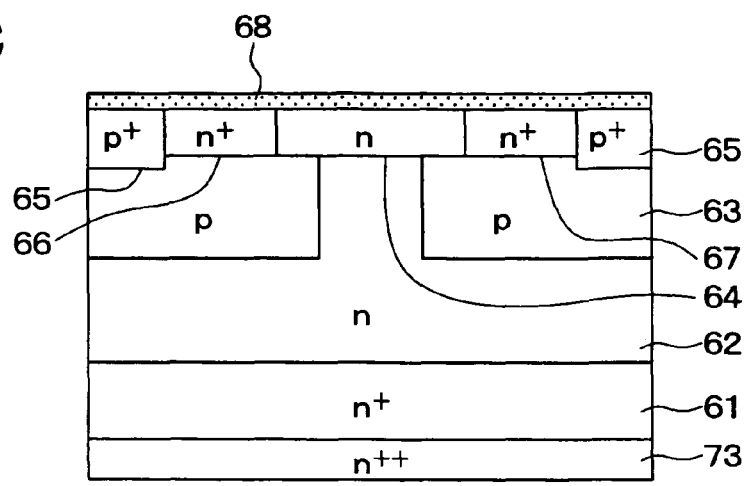

Subsequently, the step of forming the gate oxide film is performed to form the gate oxide film 68, as shown in FIG. 17C. Specifically, the gate oxide film 68 is formed by gate oxidation in accordance with a pyrogenic method using a wet atmosphere. At this time, the control of an atmosphere and a temperature in the step of forming the gate oxide film is performed as shown in FIG. 4 according to the first embodiment.

That is, from a room temperature to 1080° C., a nitrogen (N$_2$) atmosphere is maintained and a temperature is increased at a temperature gradient of 10° C./min. When 1080° C. is reached, the nitrogen atmosphere is switched to the wet (H$_2$O) atmosphere and the temperature is held for 25 minutes, whereby the gate oxide film 68 having a thickness of, e.g., 110 nm is formed. Thereafter, the temperature is decreased at 10° C./min, while the wet atmosphere is maintained. At this time, the wet atmosphere is maintained till the temperature decreases to a level of not more than 600° C.

In this manner, the wet atmosphere is maintained during the temperature decrease period in the step of forming the gate oxide film. As a result, the interface between the gate oxide film 68 and the channel epitaxial layer 64 composing the channel region has a structure in which dangling bonds are each terminated with a H or OH element.

Figure 18A:
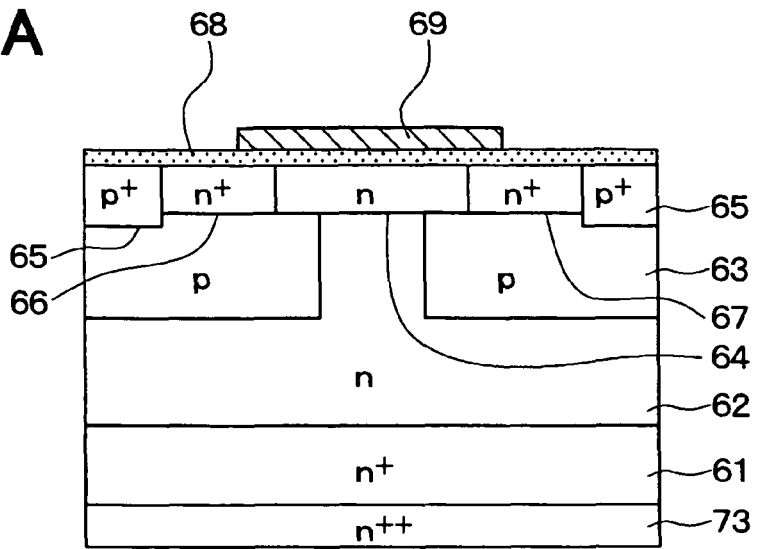
FIGS. 18A to 18C are views showing the steps of manufacturing the planar MOSFET, subsequently to FIGS. 17A to 17C.

Thereafter, as shown in FIG. 18A, a polysilicon layer doped with an n-type impurity is deposited on the surface of the gate oxide film 68 at a temperature of 600° C., and then patterned using a resist not shown, thereby forming the gate 69.

Figure 18B:
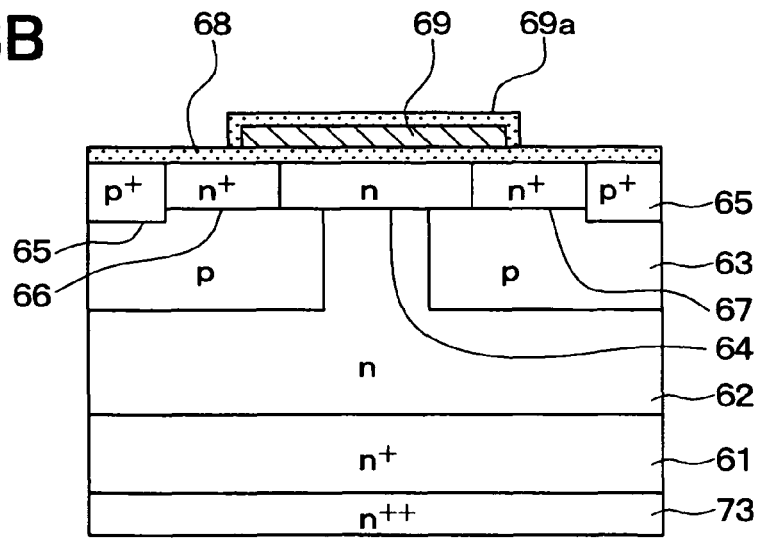

Further, as shown in FIG. 18B, round-off oxidation for the surface of the gate 69 is performed. For example, oxidation (wet oxidation) is performed for 120 minutes in a wet atmosphere at 850° C. to form an oxide film 69a on the surface of the gate 69 and round the surface of the gate 69.

At this time, the control of an atmosphere and a temperature for the wet oxidation is performed as shown in FIG. 7 according to the second embodiment to maintain the wet atmosphere when the temperature becomes not less than the termination-desorption temperature. In this case, the switching temperature from the nitrogen atmosphere to the wet atmosphere during the temperature increase period and the switching temperature from the wet atmosphere to the nitrogen atmosphere during the temperature decrease period are each set at 600° C. As a result, it is possible to prevent the desorption of H or OH from the dangling bonds at the interface between the gate oxide film 68 and the channel epitaxial layer 64.

Figure 18C:
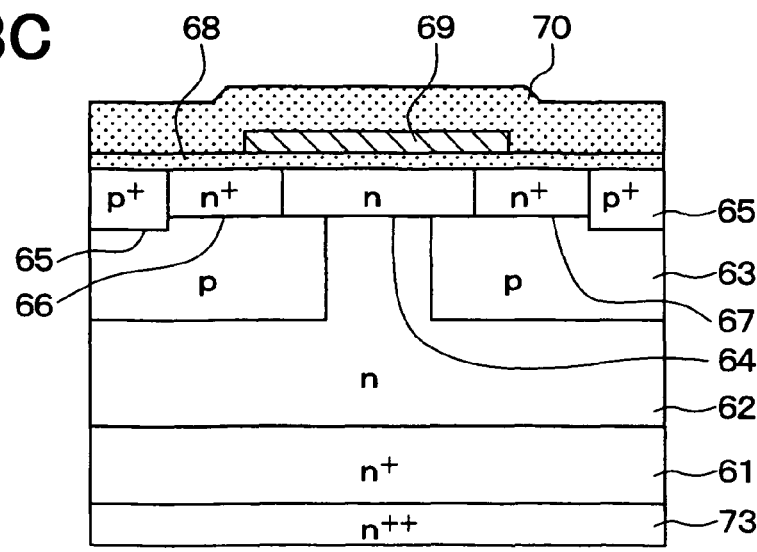

Subsequently, as shown in FIG. 18C, the interlayer insulating film 70 is deposited. For example, the interlayer insulating film 70 is formed by depositing a BPSG film at 420° C. by plasma CVD and then performing a 10-minute reflow process in a wet atmosphere at 950° C. At this time, the control of an atmosphere and a temperature for the wet oxidation is performed as shown in FIG. 9 according to the third embodiment to maintain the wet atmosphere when the temperature becomes not less than the termination-desorption temperature in the reflow process for the interlayer insulating film 70. As a result, it is possible to prevent the desorption of H or OH from the dangling bonds at the interface between the gate oxide film 68 and the channel epitaxial layer 64.

Figure 19A:
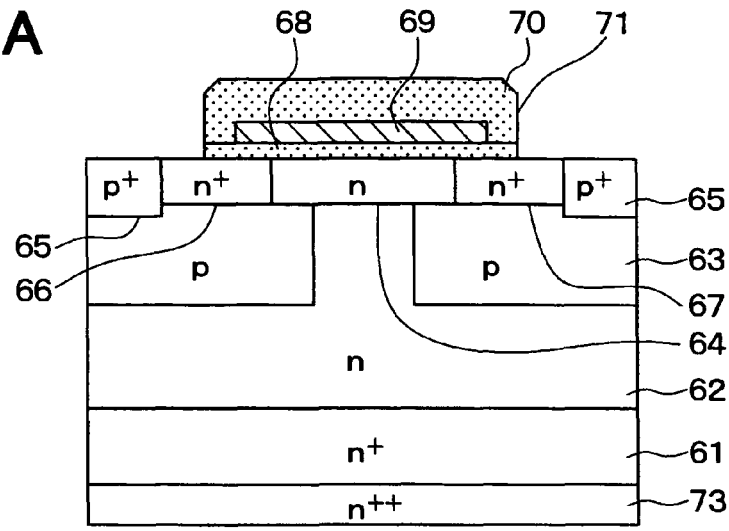
FIGS. 19A to 19C are views showing the steps of manufacturing the planar MOSFET, subsequently to FIGS. 18A to 18C.

Thereafter, as shown in FIG. 19A, the interlayer insulating film 70 is patterned so that the contact hole 71 connecting to the contact regions 65 and to the n$^+$-type source regions 66 and 67 is formed in each of the interlayer insulating film 70 and the gate oxide film 68.

Figure 19B:
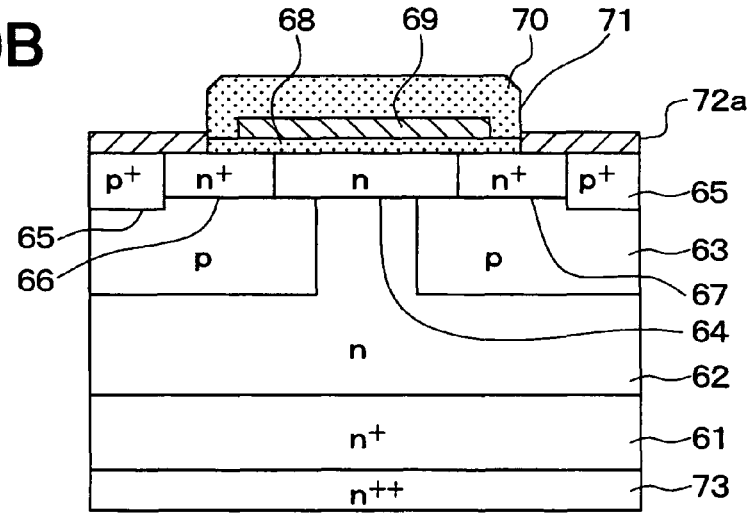
Figure 19C:
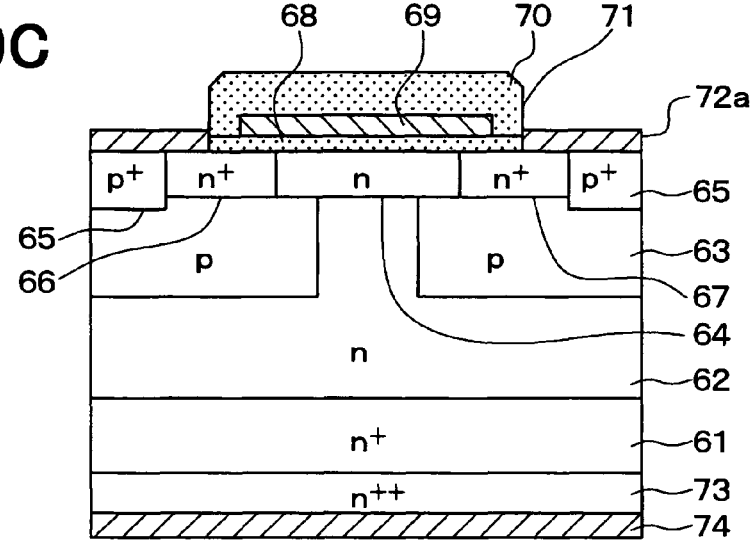

Then, as shown in FIG. 19B, a Ni film is deposited to fill the contact holes 71, and then patterned to form the contact portions 72a of the various source electrodes 72. Further, as shown in FIG. 19C, the drain electrode 74 made of Ni is formed on the back surface of the substrate 61 to come in contact with the drain contact region 73.

Thereafter, to make ohmic contacts with the contact portions 72*a* and the drain electrode 74, an annealing process is performed In an Ar atmosphere at a temperature of not more than 650° C. At this time, since each of the contact regions 65 and the n⁺-type source regions 66 and 67 has a high concentration as mentioned above, satisfactory ohmic contacts are made with the various electrodes 72 even when a high-temperature heat treatment or the like is not performed.

However, when the annealing process is performed in a hydrogen atmosphere, it becomes possible to perform the heat treatment at a temperature of not less than 650° C. By thus using the hydrogen atmosphere, it becomes also possible to perform the annealing process at, e.g., 1000° C. This suppresses the desorption of H or OH from the dangling bonds at the interface between the gate oxide film 68 and the channel epitaxial layer 64 and allows a reduction in contact resistance.

Finally, by forming the contact hole (not shown) connecting to the gate 69 in the interlayer insulating film 70 using a resist not shown and then forming the wiring electrode 72*b* of Al, the source electrodes 72 are formed, so that the planar MOSFET shown in FIG. 14 is completed.

In the method of manufacturing the planar MOSFET described above, the temperature is decreased to a level not more than the termination-desorption temperature, while the wet atmosphere is maintained, during the temperature decrease period in the step of forming the gate oxide film, as described above. As a result, it becomes possible to terminate the dangling bonds at the interface between the gate oxide film 68 and the channel epitaxial layer 64 each with a H or OH element. This achieves a reduction in interface state density and allows a planar MOSFET with a high channel mobility to be obtained.

In addition, when the temperature becomes not less than the termination-desorption temperature in the round-off oxidation for the gate 69, the wet atmosphere is maintained. As a result, it is possible to prevent the desorption of H or OH from the dangling bonds at the interface between the gate oxide film 68 and the channel epitaxial layer 64.

Further, when the temperature becomes not less than the termination-desorption temperature in the reflow process for the interlayer insulating film 70, the wet atmosphere is maintained. As a result, it is possible to prevent the desorption of H or OH from the dangling bonds at the interface between the gate oxide film 68 and the channel epitaxial layer 64.

Accordingly, even when a heat treatment is performed at a high temperature after the step of forming the gate oxide film as in the present embodiment, an increase in interface state density can be prevented by establishing the wet atmosphere when the temperature becomes not less than the termination-desorption temperature.

Other Embodiments (1) The embodiments shown above have described the case where the gate oxide films 6, 38, and 68 are formed by wet oxidation. However, when the dangling bonds at the interfaces between the gate oxide films 6, 38, and 68 and the p-type base layer 2 and the channel epitaxial layer 34 and 64 are to be terminated each with a H or OH element, it is sufficient to maintain the wet atmosphere or the hydrogen atmosphere at least during the temperature decrease period in the step of forming the gate oxide film.

Accordingly, it is also possible to form the gate oxide films 6, 38, and 68 using another technique different from the wet oxidation, switch the atmosphere to the wet atmosphere only during the temperature decrease period, and terminate the dangling bonds at the interfaces between SiC and the gate oxide films 6, 38, and 68 with H or OH during the temperature decrease period.

For example, it is appropriate to form the gate oxide film by performing oxidation in a dry atmosphere, a $N_2O$ atmosphere, a NO atmosphere, an ozone atmosphere, a $H_2O$ radical atmosphere, or the like or by depositing LTO, TEOS, HTO, or the like by CVD or the like, switch the atmosphere to the wet atmosphere by introducing $H_2O$ into a chamber for forming the gate oxide film during the subsequent temperature decrease period, and decrease the temperature to a level not more than the termination-desorption temperature. When the gate oxide film can thus be formed by the technique combined with deposition, the gate oxide film can be thickened even by a technique combined with low-temperature wet annealing at a low oxidation rate. In addition, by a reduction in the thickness of the thermally oxidized film, distortion at the interface is reduced accordingly and the interface state density can also be reduced.

Although the case where the gate insulating film is composed of the oxide film has been described herein, when this technique is used, it is also possible to compose the gate insulating film of another type of insulating film. For example, there can be listed $HfO_2$, HfSiON, HfAlO, $Al_2O_3$, $Ta_2O_5$, $Si_3N_4$, or the like.

(2) The embodiments shown above have described the case where the wet atmosphere is established during the temperature decrease period in the step of forming the gate oxide film. However, it is also possible to perform an annealing process for improving the characteristics using a wet atmosphere or a hydrogen atmosphere after the step of forming the gate oxide film.

Figure 20:
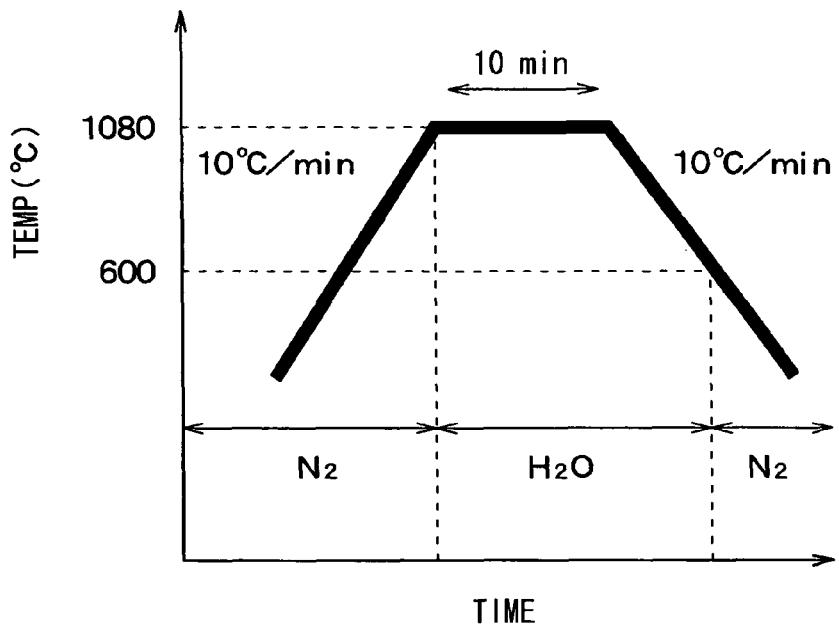
FIG. 20 is a graph showing the outline of the control of an atmosphere and a temperature in the step of forming the gate oxide film according to another embodiment.

For example, after the step shown in FIG. 3A according to the first embodiment is performed as follows, an annealing process using a wet atmosphere is continuously performed. FIG. 20 shows the outline of the control of an atmosphere and a temperature in the annealing process using the wet atmosphere.

For example, a HTO film is deposited to form the gate oxide film 6 by using, e.g., a CVD system or the like and introducing a $N_2O$ and $SiH_4$ gas at 800° C. Thereafter, the annealing process using the wet atmosphere is performed.

That is, from a room temperature to 1080° C., a nitrogen ($N_2$) atmosphere is maintained and the temperature is increased at a temperature gradient of 10° C./min. When 1080° C. is reached, the nitrogen atmosphere is switched to the wet ($H_2O$) atmosphere and the temperature is held for 10 minutes, whereby the annealing process is performed. Thereafter, the temperature is decreased at 10° C./min, while the wet atmosphere is maintained. At this time, the wet atmosphere is maintained till the temperature decreases to a level of not more than 600° C.

In this manner, the annealing process is performed after the step of forming the gate oxide film and the wet atmosphere is maintained during the temperature decrease period in the annealing process. As a result, it is possible to terminate the dangling bonds at the interface between the gate oxide film 6 and the p-type base layer 2 composing the channel region each with a H or OH element.

This also achieves the same effects as achieved by each of the embodiments described above. When the annealing process is thus performed after the step of forming the gate oxide film, the gate oxide film may also be formed by a technique other than the wet oxidation or, alternatively, the gate insulating film may also be formed of another type of insulating film, not of an oxide film.

It will easily be appreciated that, after forming the gate oxide film 6, 38, or 68 using the wet atmosphere, performing such an annealing process in order to further improve the characteristics is also effective.

(3) Likewise, although the wet atmosphere is constantly maintained during the temperature decrease period in the step of forming the gate oxide film till the temperature reaches 600° C., it is sufficient to maintain the wet atmosphere in a temperature range including at least a termination-desorption temperature range.

Figure 21:
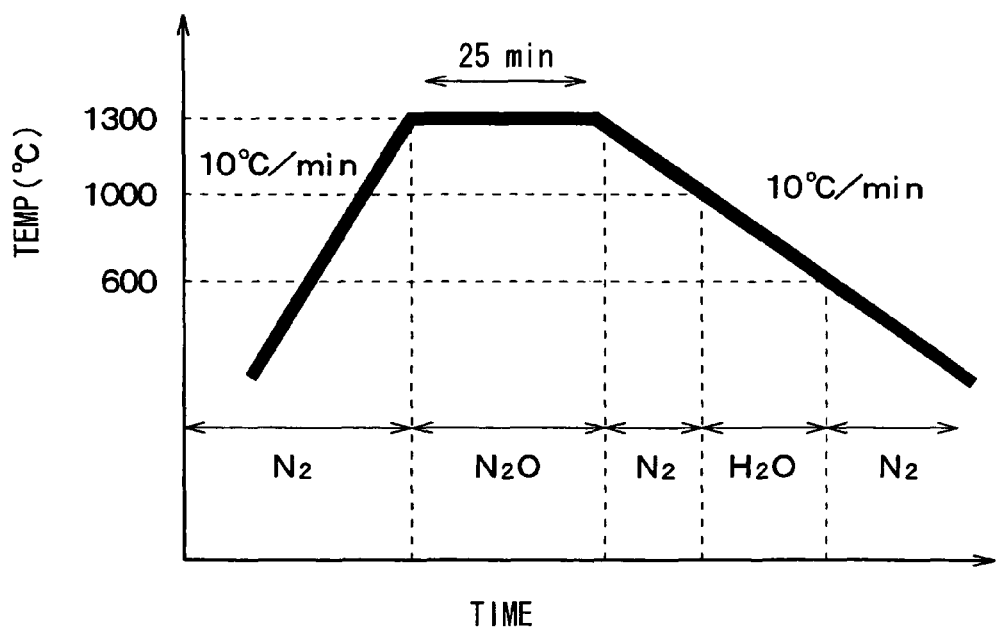
FIG. 21 is a graph showing the outline of the control of an atmosphere and a temperature in the step of forming the gate oxide film according to further another embodiment.
Figure 22A:
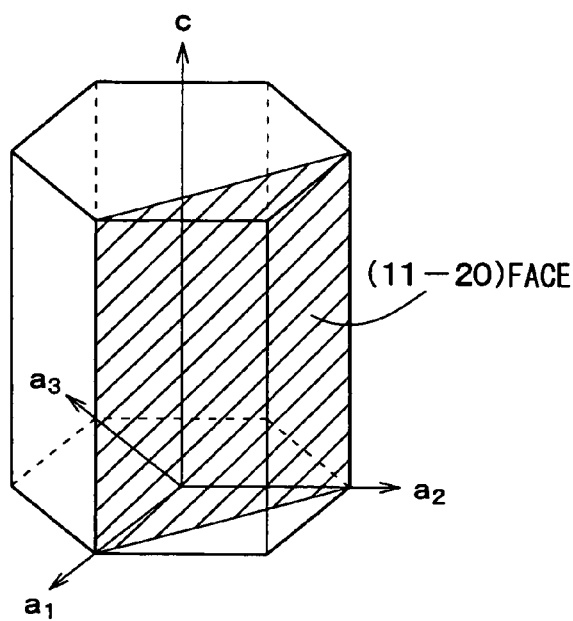
FIGS. 22A and 22B are crystal-face schematic views showing the relationships between a hexagonal crystal structure of SiC and the surface orientations of crystal faces, i.e., a (11-20) face, a (0001) Si face, and a (000-1) C face.
Figure 22B:
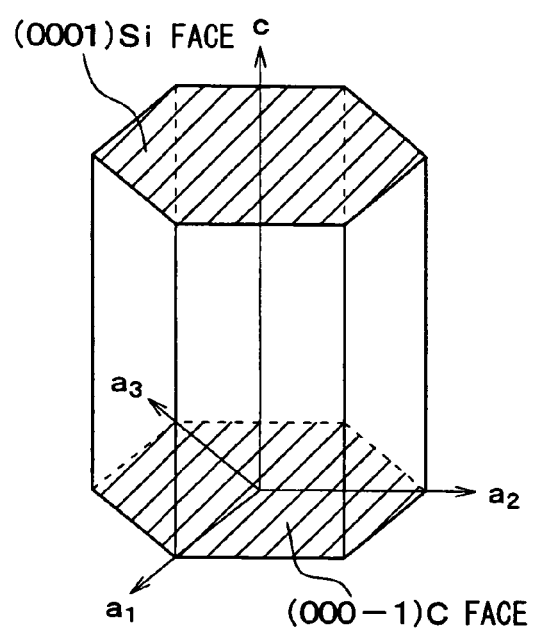

For example, in the step shown in FIG. 3A according to the first embodiment, control of an atmosphere and a temperature as shown in FIG. 21 can be performed.

That is, from a room temperature to 1300° C., a nitrogen atmosphere is maintained and the temperature is increased at a temperature gradient of 10° C./min. When 1300° C. is reached, the nitrogen atmosphere is switched to a $N_2O$ atmosphere (diluted with $N_2$) and oxidation is performed for 25 minutes to form the gate oxide film 6. Subsequently, the nitrogen atmosphere is restored and the temperature is decreased at a temperature gradient of 10° C./min. When 1000° C. is reached, the nitrogen atmosphere is switched to the wet atmosphere and the temperature is decreased at 10° C./min till reaching a level of not more than 600° C., while the wet atmosphere is maintained. Thereafter, when the temperature becomes 600° C., the nitrogen atmosphere is restored and the temperature is decreased to the room temperature.

In this manner, by maintaining the wet atmosphere in the temperature range including at least the termination-desorption temperature during the temperature decrease period in the step of forming the gate oxide film, it is possible to terminate the dangling bonds at the interface between the gate oxide film 6 and the p-type base layer 2 composing the channel region each with a H or OH element.

In the case of thus using the $N_2O$ atmosphere, the dangling bonds at the interface between the gate oxide film 6 and the p-type base layer 2 composing the channel region can also be terminated not only with H or OH but also with N. As a result, it becomes possible to further reduce the interface state density and further improve the channel mobility. The same holds true not only to gate oxidation performed using the $N_2O$ atmosphere but also to gate oxidation performed using a NO atmosphere and the interface state density can further be reduced.

(4) In each of the embodiments described above, the wet atmosphere is formed by the pyrogenic method. However, it is also possible to form the wet atmosphere using a bubbling method with boiled $H_2O$.

(5) Each of the second to fifth embodiments has described a combination of the technique which establishes the wet atmosphere during the temperature decrease period in the step of forming the gate oxide film and the technique which performs the annealing process, the reflow process, or the like in the wet atmosphere or the hydrogen atmosphere. However, it is not essential to combine these techniques. Even when each of the techniques is used alone, the effects described above are achievable.

(6) In the embodiments shown above, the inversion-mode lateral MOSFET, the accumulation-mode lateral MOSFET, and the planar MOSFET have been described as examples of the semiconductor device having a MOS structure. However, these are only illustrative of the semiconductor device having the MOS structure. The present invention is also applicable to, e.g., an IGBT having a MOS structure and to a trench-gate MOSFET. In case of the trench gate MOSFET, a groove having a perpendicular sidewall is formed on a (000-1)-orientation c-surface of a substrate. The sidewall of the trench is used as a channel surface so that the channel surface is the (000-1)-orientation surface, which has high channel mobility. Accordingly, the high channel mobility MOSFET is obtained. Briefly, the present invention is applicable to any semiconductor device having a MOS structure, in which a channel surface is a (000-1)-orientation c-surface so that the device has high channel mobility.

(7) In each of the embodiments described above, the wet atmosphere or the hydrogen atmosphere need not necessarily be 100%, and may also be diluted with another gas.

(8) In the case of showing the orientation of a crystal, a bar should intrinsically be placed over a desired number. However, because of representation limitations placed by electronic filing, it is assumed in the present specification that a bar is placed prior to a desired number.

The above disclosure has the following aspects.

According to a first aspect of the present disclosure, a silicon carbide semiconductor device having a MOS structure includes: a substrate made of silicon carbide and having a principal surface; a channel region made of silicon carbide and disposed in the substrate, wherein the channel region provides a current path as a channel; a first impurity region disposed on an upstream side of the current path and a second impurity region disposed on a downstream side of the current path; a gate insulating film disposed on a surface of the channel region; and a gate disposed on the gate insulating film. The channel of the channel region for flowing current between the first impurity region and the second impurity region is controlled by a voltage applied to the gate. An interface between the channel region and the gate insulating film has a hydrogen concentration equal to or greater than $4.7 \times 10^{20}$ cm$^{-3}$, and the interface provides a channel surface having a (000-1)-orientation surface.

By thus using the substrate having the (000-1) C face as the principal surface thereof, terminating the dangling bond at the interface between the channel region and the gate insulating film with H or OH, and setting the hydrogen concentration at the interface to a high value of not less than $4.7 \times 10^{20}$ cm$^{-3}$, the interface state density lowers and a silicon carbide semiconductor device with a high channel mobility can be provided.

Alternatively, the dangling bond at the interface may be further terminated with a nitrogen atom. Further, the interface between the channel region and the gate insulating film may have a dangling bond, which is terminated with a H atom, a $H_2$ molecule, a deuterium atom and a deuterium molecule, and one of the H atom, a $H_2$ molecule, a deuterium atom and a deuterium molecule terminating the dangling bond has a desorption amount peak in a range between 650° C. and 850° C.

According to a second aspect of the present disclosure, a method for manufacturing a silicon carbide semiconductor device having a MOS structure, the method includes: preparing a substrate made of silicon carbide having a principal surface; forming a channel region made of silicon carbide on the substrate, wherein the channel region provides a current path as a channel; forming a first impurity region on an upstream side of the current path and a second impurity region on a downstream side of the current path; forming a gate insulating film on a surface of the channel region; forming a gate on the gate insulating film; and performing a heat treatment. The channel of the channel region for flowing current between the first impurity region and the second impurity region is controlled by a voltage applied to the gate. The performing the heat treatment includes: reducing temperature in a range between 650° C. and 850° C.; and maintaining a wet atmosphere or a hydrogen atmosphere continuously in the reducing the temperature. The interface provides a channel surface having a (000-1)-orientation surface.

By maintaining the wet atmosphere or the hydrogen atmosphere continuously in the reducing the temperature, the dangling bond at an interface between the gate insulating film and the channel region is terminated with the H atom or the OH group. Thus, the interface state density lowers and a silicon carbide semiconductor device with a high channel mobility can be provided.

Alternatively, the performing the heat treatment may provide to form the gate insulating film in the forming the gate insulating film, and the maintaining the wet atmosphere or the hydrogen atmosphere is performed in the reducing the temperature of the forming the gate insulating film. Further, the maintaining the wet atmosphere or the hydrogen atmosphere may be performed until the temperature is reduced equal to or smaller than 650° C. in the forming the gate insulating film. Further, the maintaining the wet atmosphere or the hydrogen atmosphere may be performed until the temperature is reduced equal to or smaller than 600° C. in the forming the gate insulating film. Further, the forming the gate insulating film may further include increasing the temperature equal to or greater than 850° C. in the wet atmosphere so that a gate oxide film as the gate insulating film is formed by wet oxidation. Furthermore, in the forming the gate insulating film, the wet atmosphere may be maintained in the reducing the temperature after the increasing the temperature.

Alternatively, in the forming the gate insulating film, the gate insulating film may be formed by a method other than wet oxidation in the wet atmosphere. Further, the gate insulating film may be formed by oxidation in an $N_2O$ atmosphere or a NO atmosphere so that a gate oxide film as the gate insulating film is formed.

Alternatively, the forming the gate insulating film may further include depositing a LTO, TEOS or HTO film as a part of the gate insulating film.

Alternatively, the forming the gate insulating film may further include maintaining the temperature to be a predetermined temperature in a range between 650° C. and 850° C. for a predetermined time in the reducing the temperature.

Alternatively, the performing the heat treatment may be performed as an anneal process for improving characteristics of the interface between the gate insulating film and the channel region after the forming the gate insulating film. Further, the maintaining the wet atmosphere or the hydrogen atmosphere may be performed in the reducing the temperature of the anneal process in a temperature range between 650° C. and 850° C. Further, the maintaining the wet atmosphere or the hydrogen atmosphere may be performed until the temperature is reduced equal to or smaller than 600° C. in the reducing the temperature of the anneal process. Further, the maintaining the wet atmosphere or the hydrogen atmosphere may be performed when the temperature is equal to or greater than 650° C. in both of a temperature increasing step and a temperature reducing step of the anneal process. Further, the anneal process may further include maintaining the temperature to be a predetermined temperature in a range between 650° C. and 850° C. for a predetermined time in the reducing the temperature of the anneal process.

Alternatively, the maintaining the wet atmosphere or the hydrogen atmosphere may be performed when the temperature is equal to or greater than 650° C. after the forming the gate insulating film. Further, the method may further include: at least one of round-off oxidizing, reflowing and electrode annealing. The round-off oxidizing provides to round a surface of the gate. The reflowing provides to reflow an interlayer insulating film. The electrode annealing provides to anneal an electrode. The maintaining the wet atmosphere or the hydrogen atmosphere is performed when the temperature is equal to or greater than 650° C. after the forming the gate insulating film.

Alternatively, all steps after the forming the gate insulating film may be performed within a temperature equal to or smaller than 650° C.

Alternatively, the method may further include: annealing at a predetermined temperature equal to or smaller than 650° C. in an atmosphere different from the wet atmosphere after the performing the heat treatment.

Alternatively, the principal surface of the substrate may be a (000-1)-orientation face.

Alternatively, the principal surface of the substrate may be a face perpendicular to a (000-1)-orientation face. The substrate further includes a trench having a sidewall, which is provided by the (000-1)-orientation face, and the gate insulating film is disposed in the trench so that a trench gate MOSFET is formed.

Alternatively, in the maintaining the wet atmosphere or the hydrogen atmosphere continuously, a dangling bond at an interface between the gate insulating film and the channel region may be terminated with a H atom or a OH group.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a silicon carbide semiconductor device having a MOS structure, the method comprising:
   preparing a substrate made of silicon carbide and having a principal surface;
   forming a channel region made of silicon carbide on the substrate, wherein the channel region provides a current path as a channel;
   forming a first impurity region on an upstream side of the current path and a second impurity region on a downstream side of the current path;
   forming a gate insulating film on a surface of the channel region;
   forming a gate on the gate insulating film;
   performing a heat treatment, and
   performing at least one of round-off oxidizing, reflowing, and electrode annealing wherein
   the channel of the channel region for flowing current between the first impurity region and the second impurity region is controlled by a voltage applied to the gate,
   an interface between the channel region and the gate insulating film provides a channel surface having a (000-1)-orientation surface,
   the performing the heat treatment includes:
      reducing temperature in a range between 650° C. and 850° C.; and
      maintaining a wet atmosphere or a hydrogen atmosphere continuously during reducing the temperature,
   the maintaining the wet atmosphere or the hydrogen atmosphere is performed when the temperature is equal to or greater than 650° C. after the forming the gate insulating film,
   the round-off oxidizing rounds a surface of the gate,
   the reflowing forms an interlayer insulating film, and
   the electrode annealing provides an annealed electrode.

* * * * *